(12) United States Patent
Hachisuka

(10) Patent No.: US 6,784,066 B2
(45) Date of Patent: Aug. 31, 2004

(54) METHOD FOR MANUFACTURING SEMICONDUCTOR DEVICE AND SEMICONDUCTOR DEVICE MANUFACTURED THEREBY

(75) Inventor: Atsushi Hachisuka, Tokyo (JP)

(73) Assignee: Renesas Technology Corp., Tokyo (JP)

(*) Notice: Subject to any disclaimer, the term of this patent is extended or adjusted under 35 U.S.C. 154(b) by 87 days.

(21) Appl. No.: 09/960,974

(22) Filed: Sep. 25, 2001

(65) Prior Publication Data

US 2002/0123181 A1 Sep. 5, 2002

(30) Foreign Application Priority Data

Mar. 2, 2001 (JP) ..................................... 2001-057659

(51) Int. Cl.⁷ .............................................. H01L 21/20
(52) U.S. Cl. ...................................................... 438/383
(58) Field of Search .............................. 438/194, 197, 438/230–232, 201, 203, 279, 289, 301, 305, 306, 332, 383, 529, 514, 527, 560, FOR 168, FOR 208, 275, 276; 257/336, 344, 408, E29.012, E29.278, E21.435

(56) References Cited

U.S. PATENT DOCUMENTS

| | | | | |
|---|---|---|---|---|
| 5,907,779 A | * | 5/1999 | Choi ........................... | 438/279 |
| 5,908,315 A | * | 6/1999 | Gardner et al. .............. | 438/305 |
| 6,124,610 A | * | 9/2000 | Cheek et al. ................ | 257/328 |
| 6,207,519 B1 | * | 3/2001 | Kim et al. .................... | 438/303 |
| 6,238,977 B1 | * | 5/2001 | Sung ........................... | 438/261 |
| 6,277,683 B1 | * | 8/2001 | Pradeep et al. ............. | 438/200 |
| 6,294,415 B1 | * | 9/2001 | Tseng et al. ................. | 438/197 |
| 6,316,304 B1 | * | 11/2001 | Pradeep et al. ............. | 438/230 |
| 6,329,225 B1 | * | 12/2001 | Rodder ......................... | 438/151 |
| 6,335,279 B2 | * | 1/2002 | Jung et al. ................... | 438/666 |
| 6,451,704 B1 | * | 9/2002 | Pradeep et al. ............. | 438/719 |
| 6,455,362 B1 | * | 9/2002 | Tran et al. ................... | 438/194 |
| 6,472,283 B1 | * | 10/2002 | Ishida et al. ................. | 438/305 |
| 6,483,154 B1 | * | 11/2002 | Ngo et al. .................... | 257/384 |
| 6,492,218 B1 | * | 12/2002 | Mineji ......................... | 438/199 |
| 6,504,218 B1 | * | 1/2003 | Kadosh et al. ............... | 257/369 |
| 6,507,123 B1 | * | 1/2003 | Woo et al. .................... | 257/384 |
| 6,512,273 B1 | * | 1/2003 | Krivokapic et al. ......... | 257/369 |
| 6,518,130 B1 | * | 2/2003 | Ohno ........................... | 438/275 |

* cited by examiner

*Primary Examiner*—Olik Chaudhuri
*Assistant Examiner*—Brook Kebede
(74) *Attorney, Agent, or Firm*—McDermott, Will & Emery

(57) ABSTRACT

A plurality of gate electrodes is formed on a semiconductor substrate having a DRAM area and a logic area. Next, sidewalls, each of which includes a silicon nitride film covering the sides of gate electrodes and a silicon oxide film covering the silicon nitride film, are formed on the sides of the gate electrodes respectively. After formation of a transistor having an LDD structure in the logic area, the silicon oxide film formed on the sides of the gate electrodes is removed by wet etching. Next, a silicon nitride film is formed on the whole surface of the semiconductor substrate, and an interlayer dielectric is formed on the silicon nitride film.

16 Claims, 28 Drawing Sheets

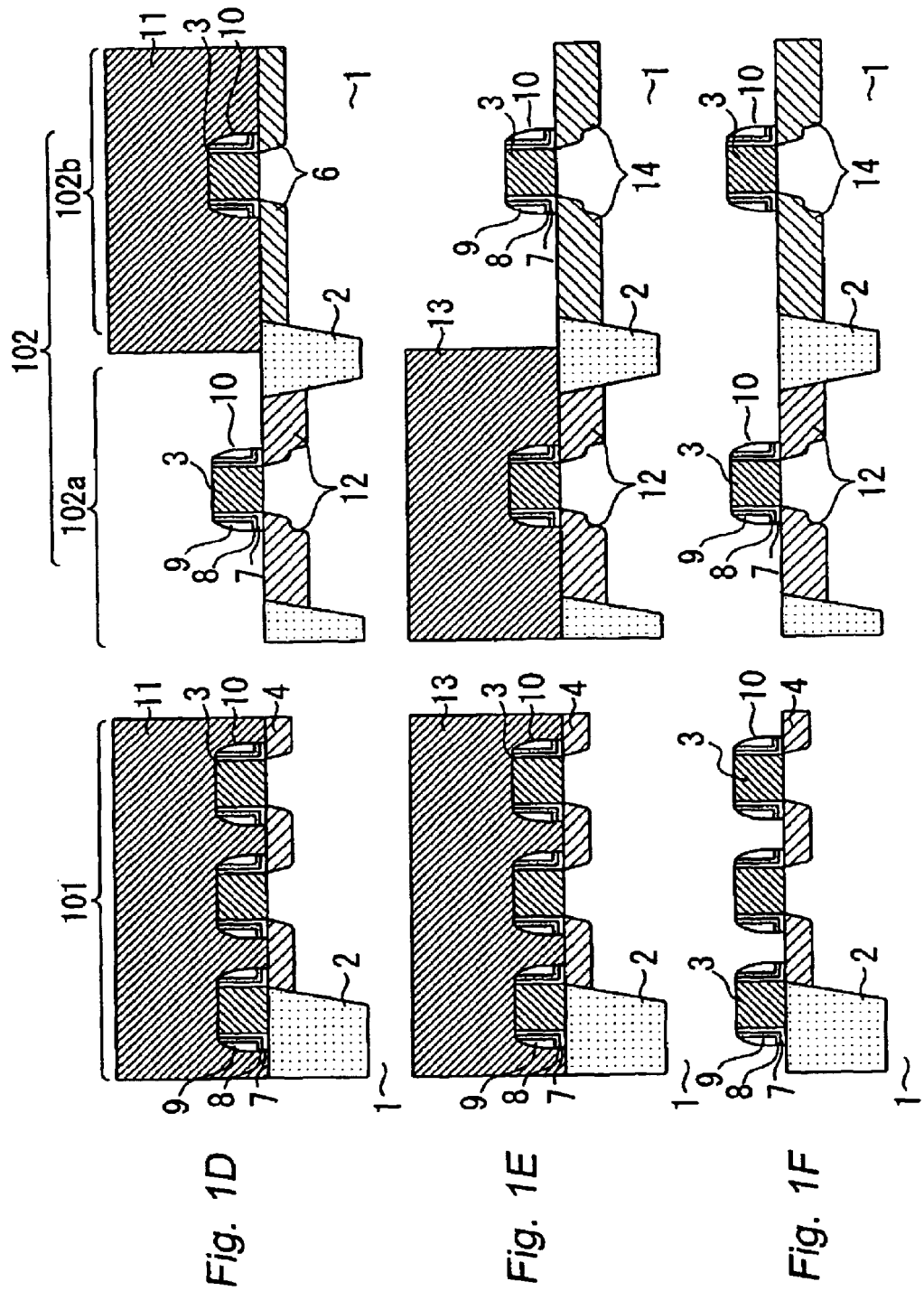

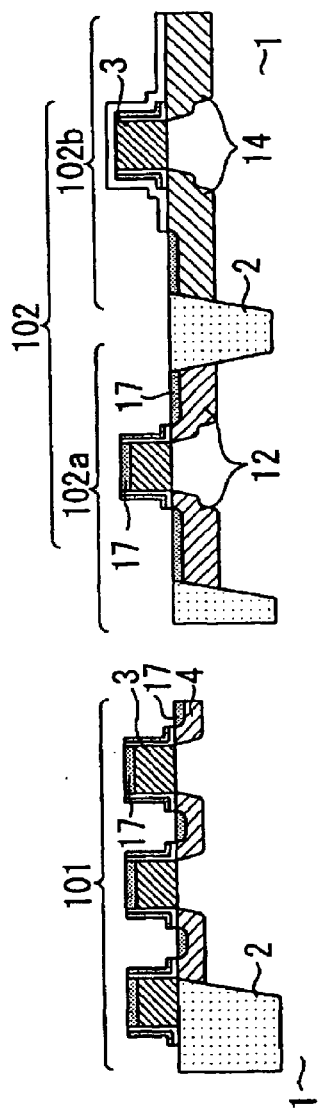
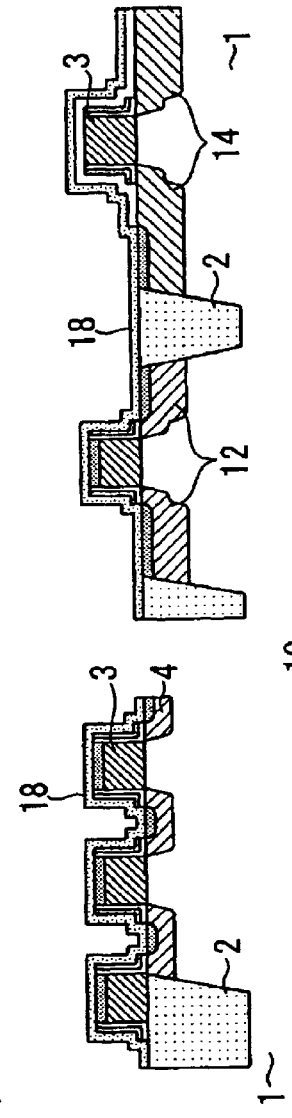
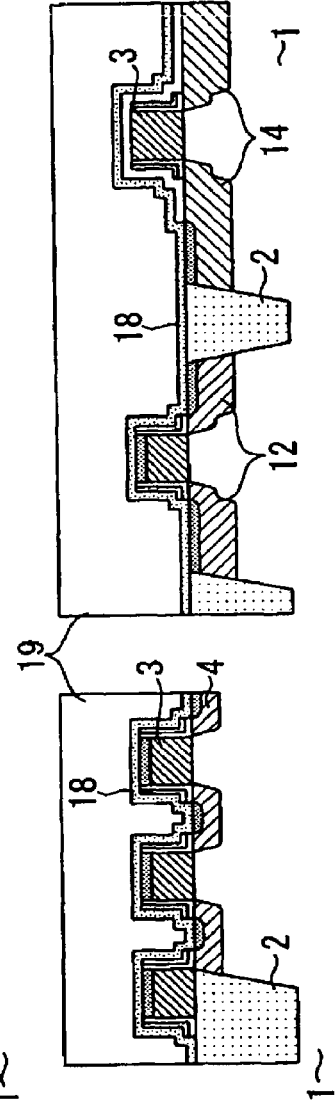
Fig. 1J
Fig. 1K
Fig. 1L

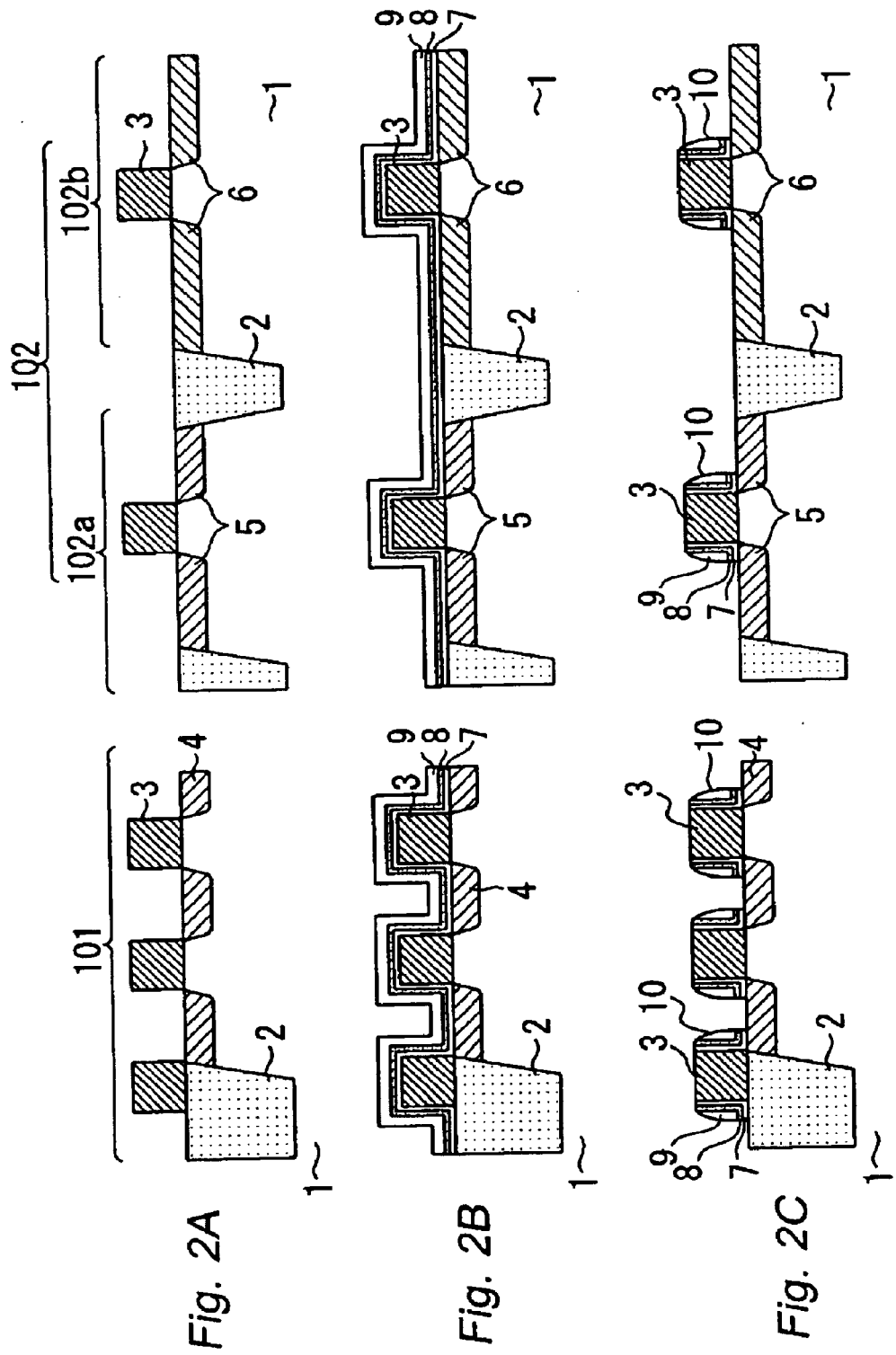

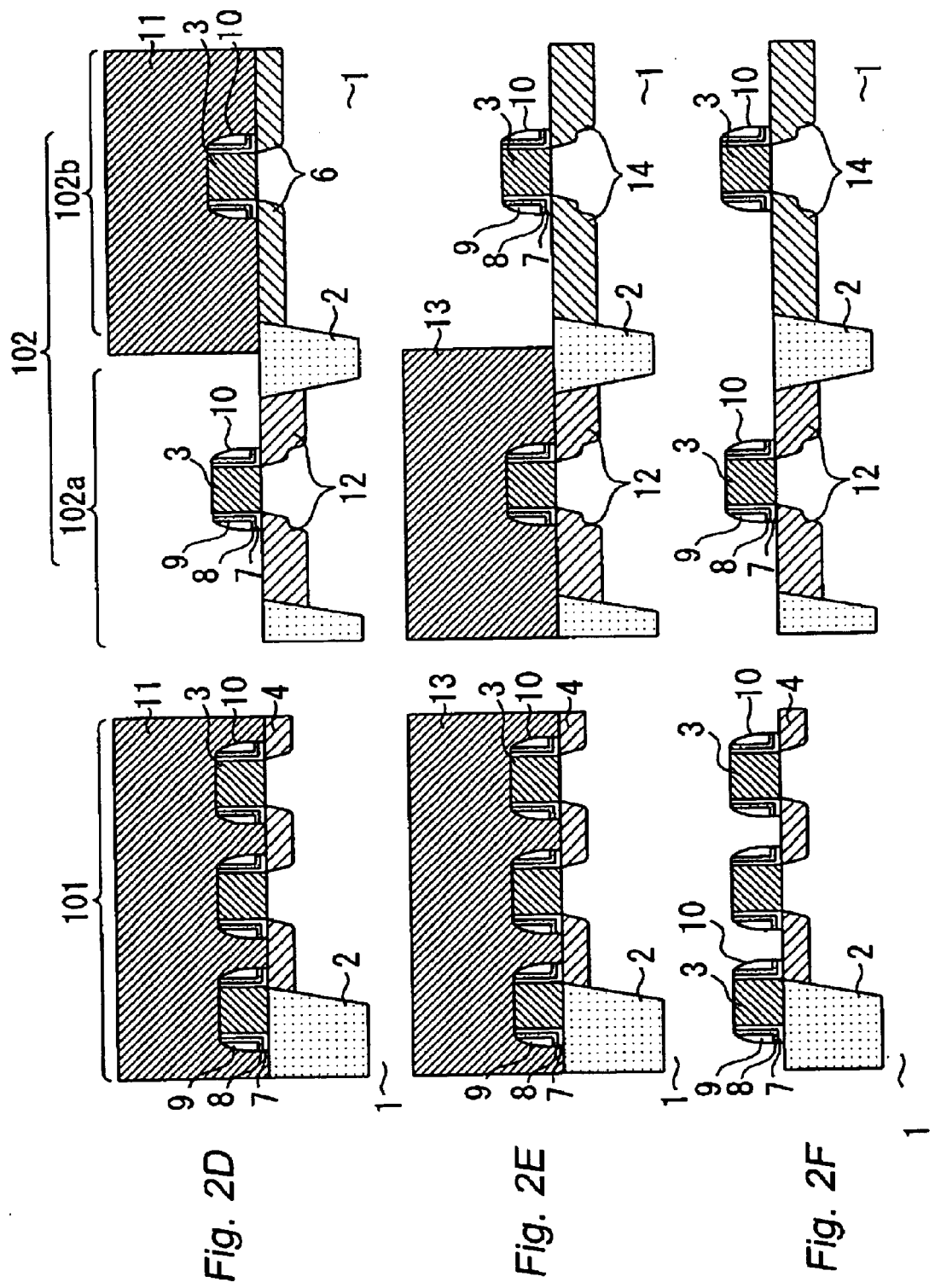

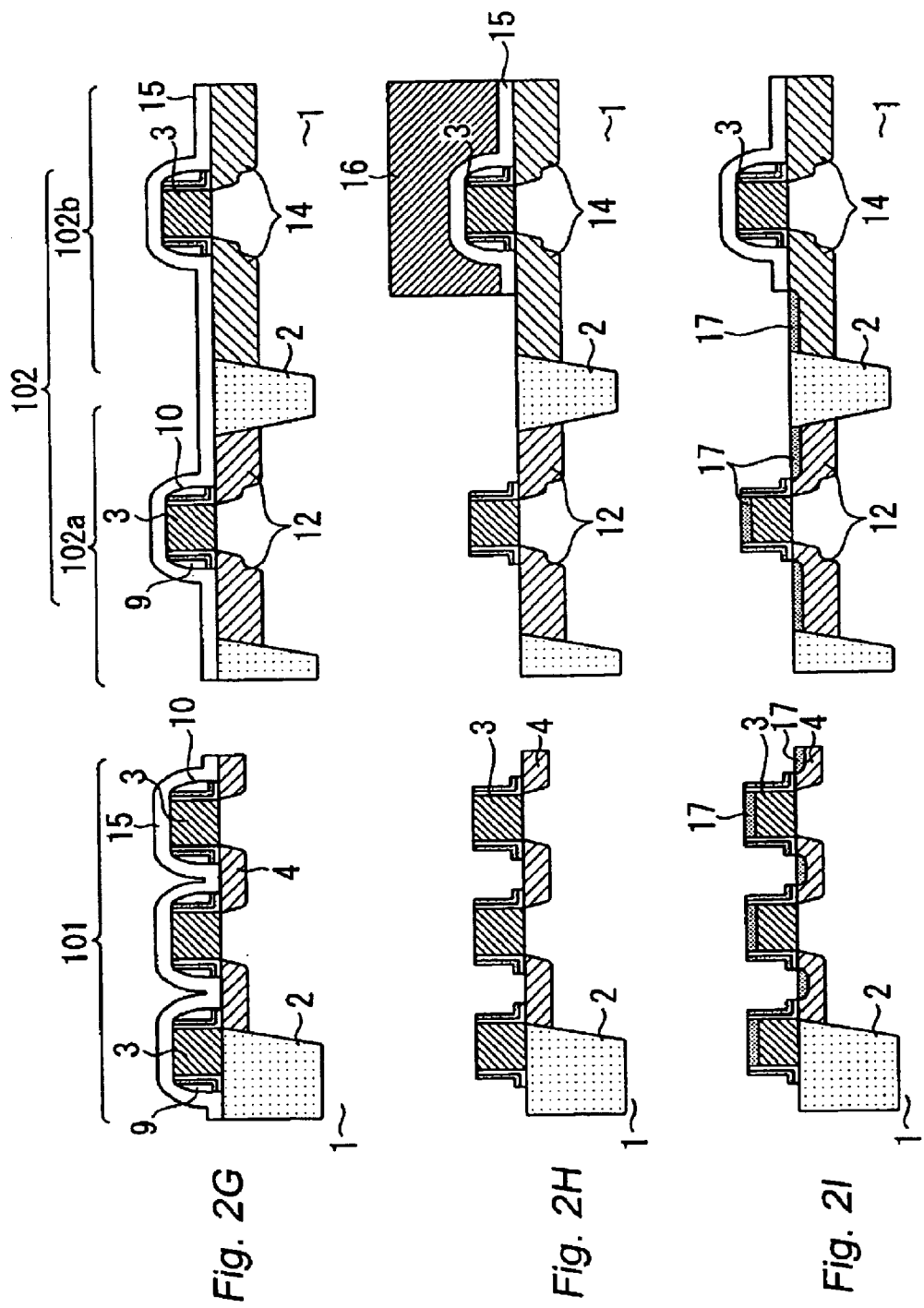

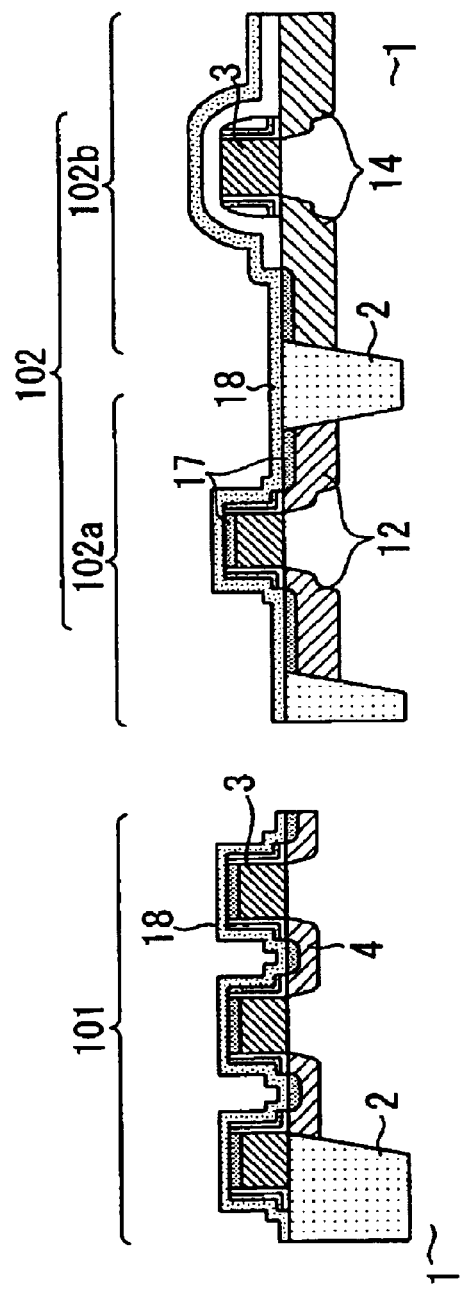
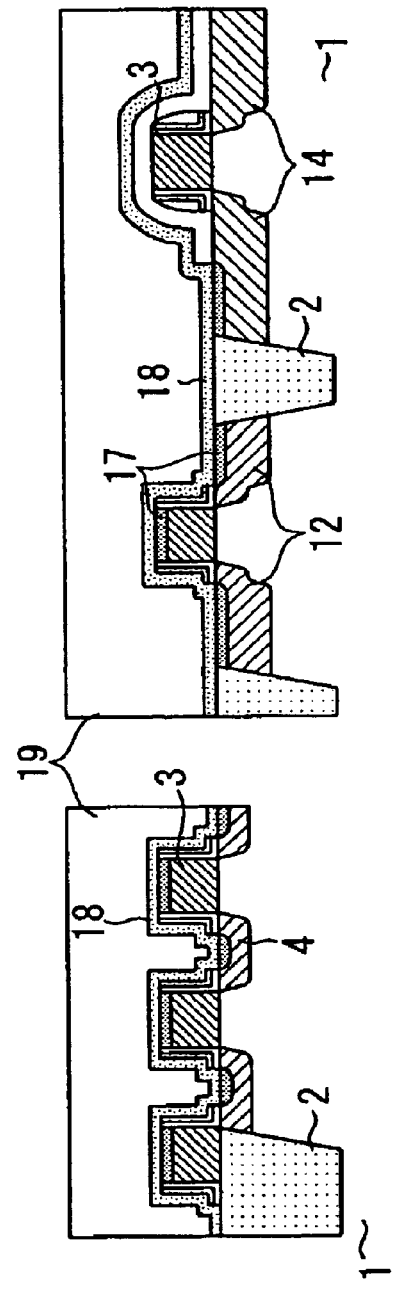

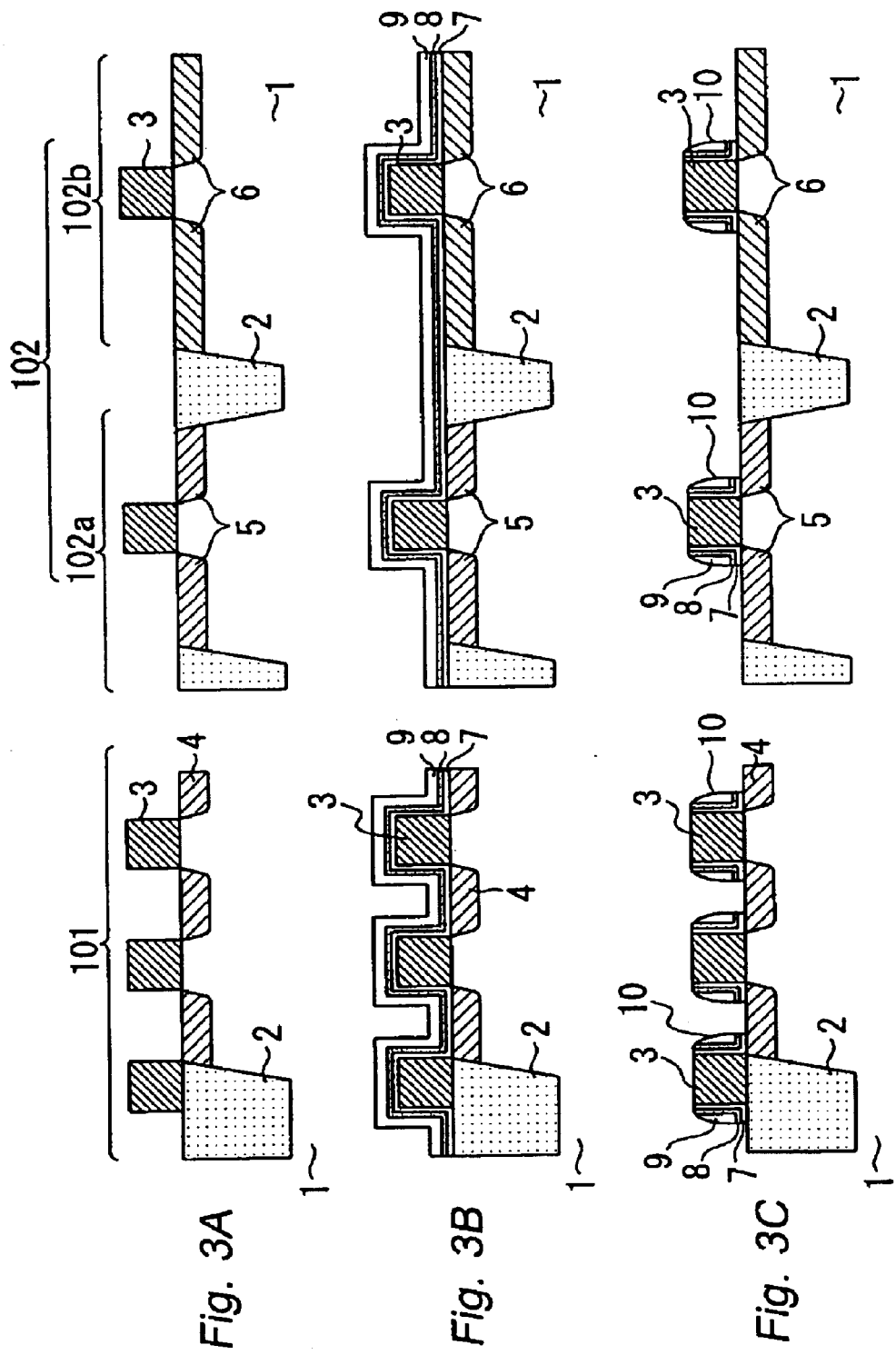

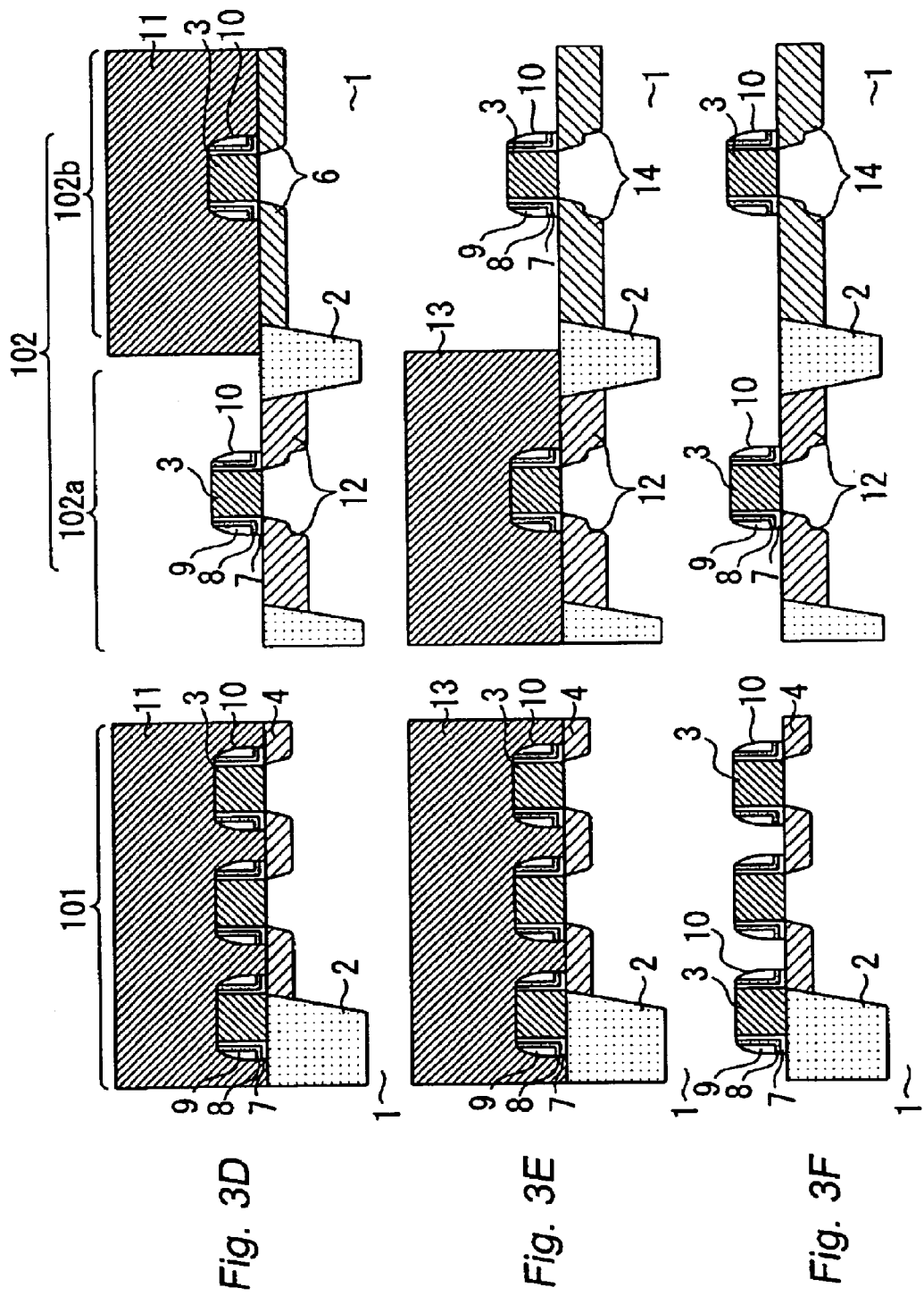

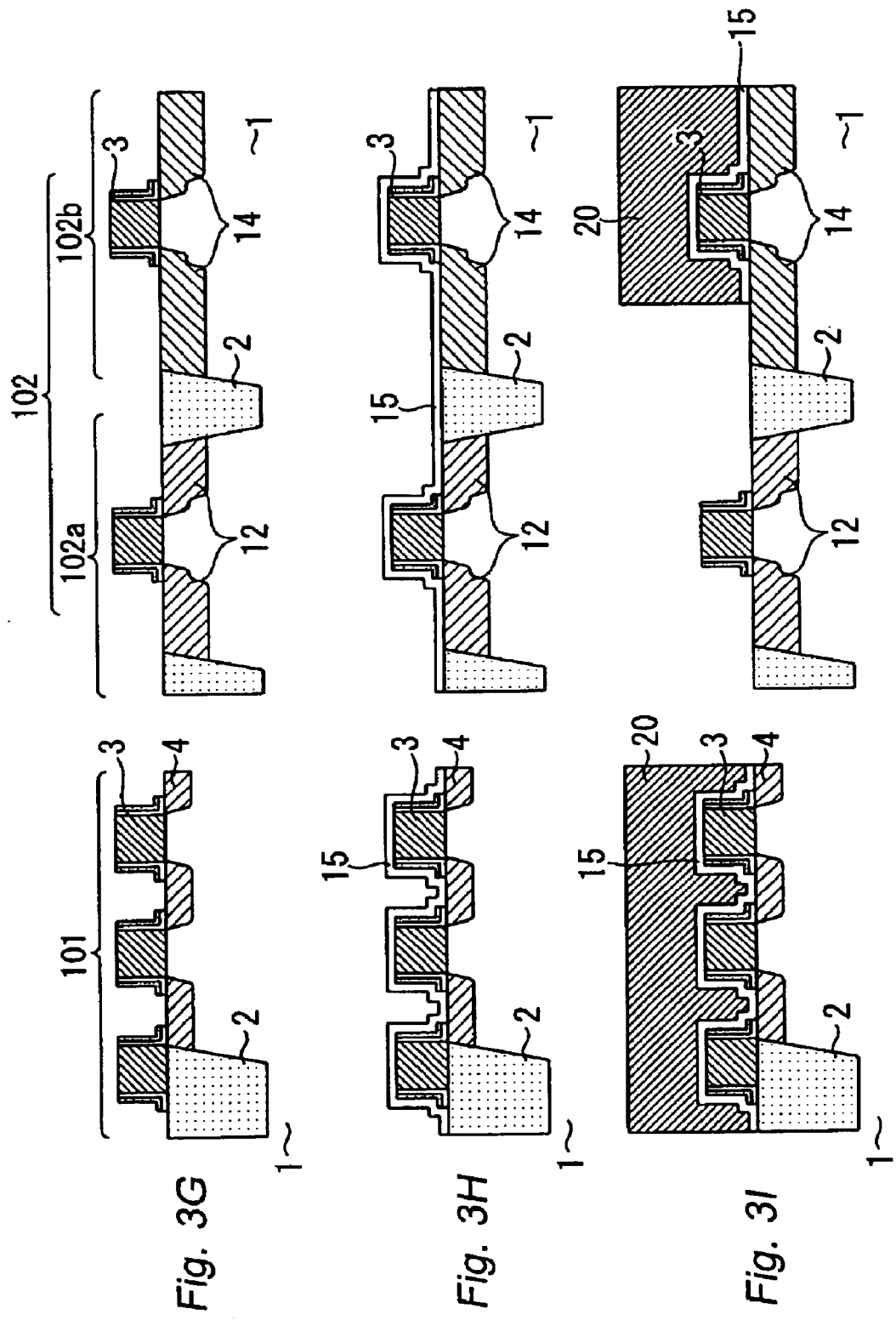

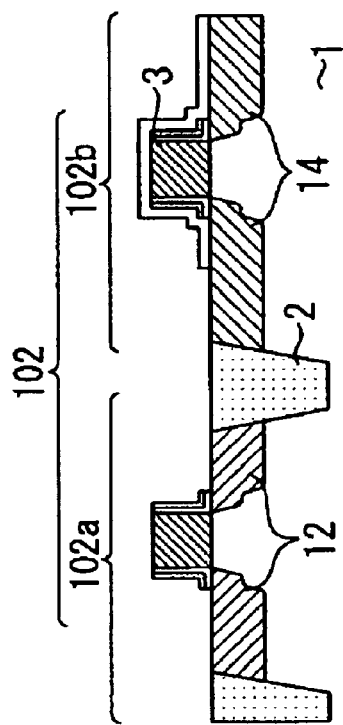
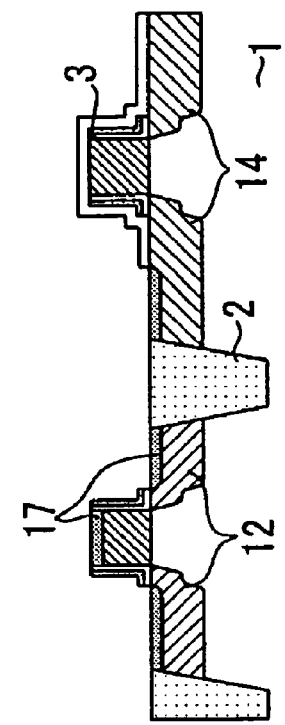
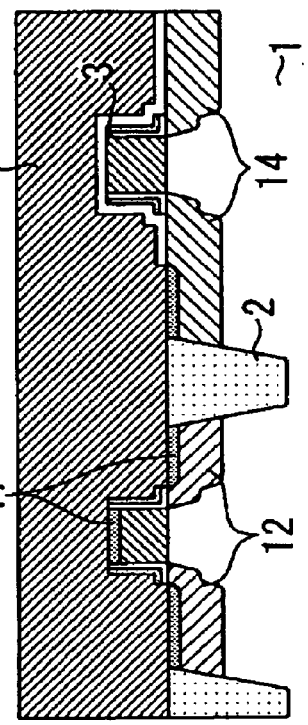
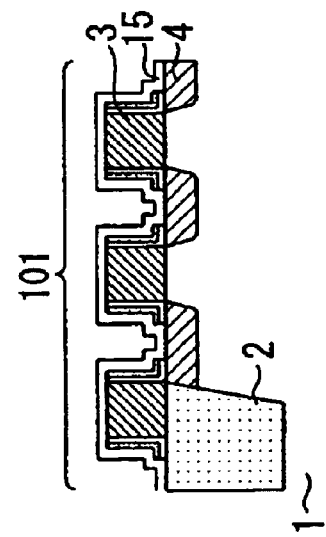
Fig. 3J
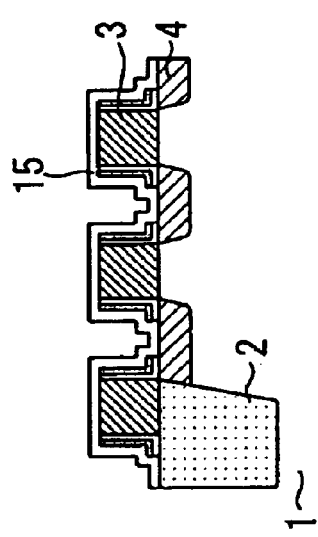
Fig. 3K
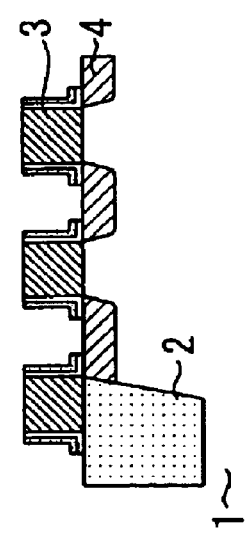
Fig. 3L

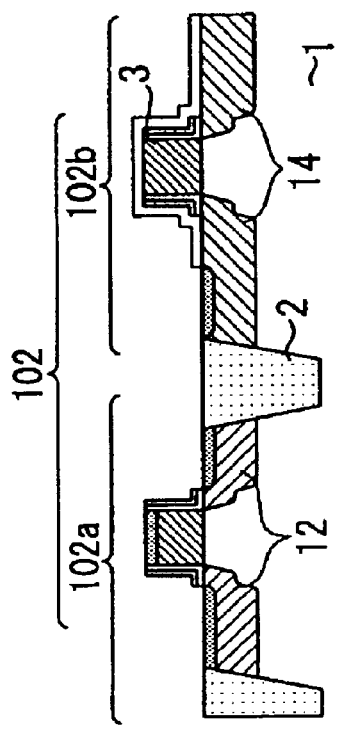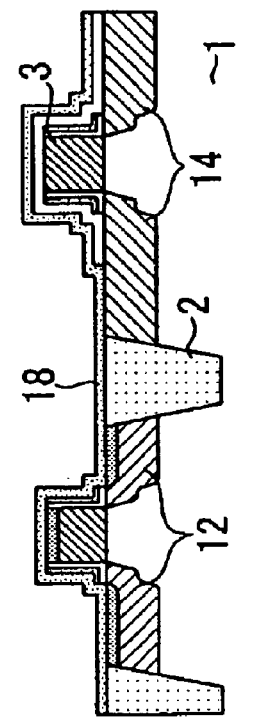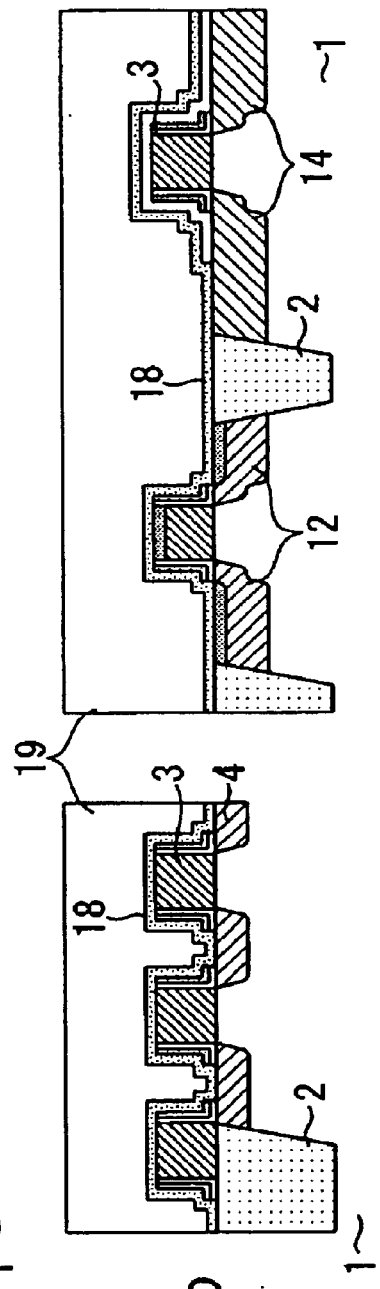
Fig. 3M
Fig. 3N
Fig. 3O

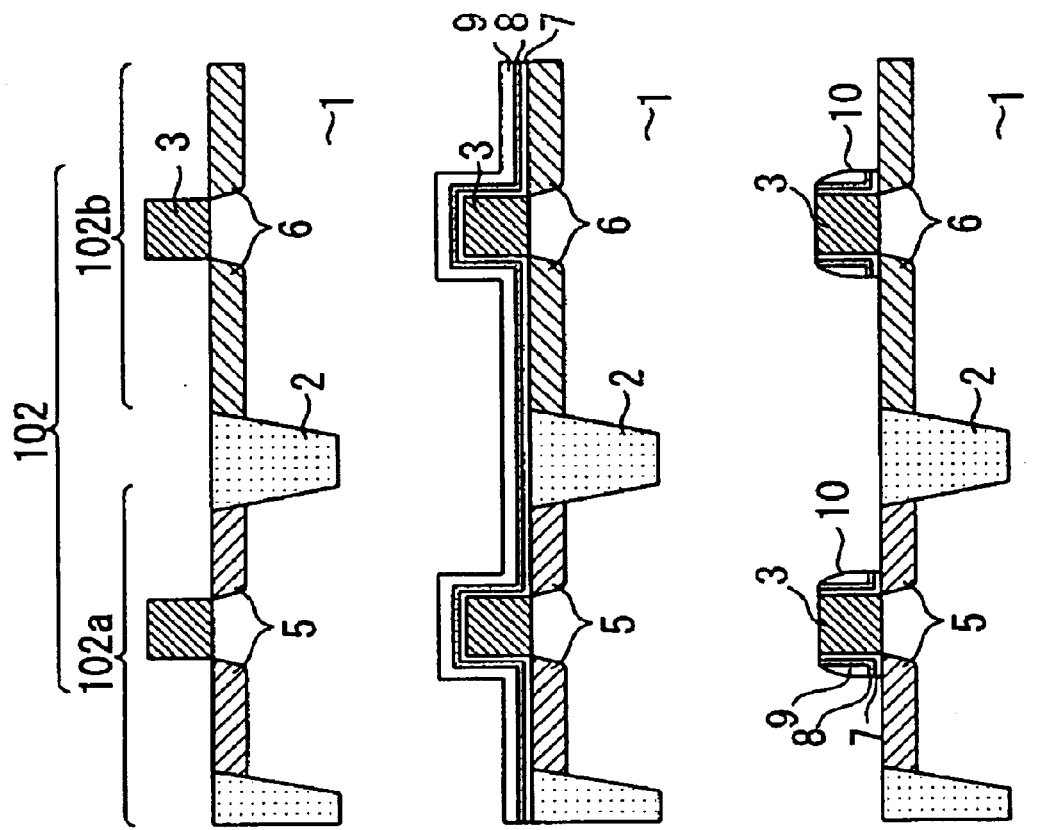
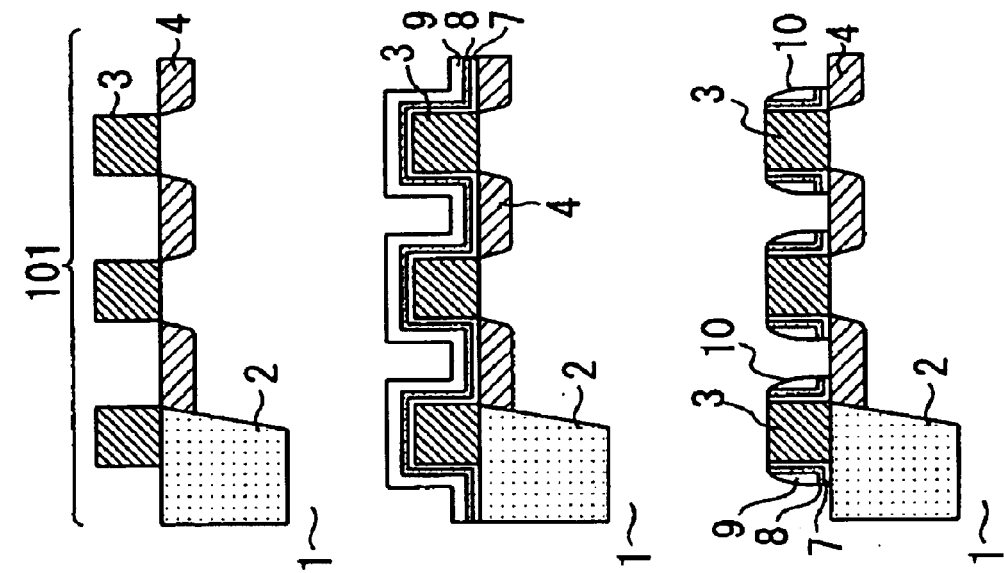
Fig. 4A
Fig. 4B
Fig. 4C

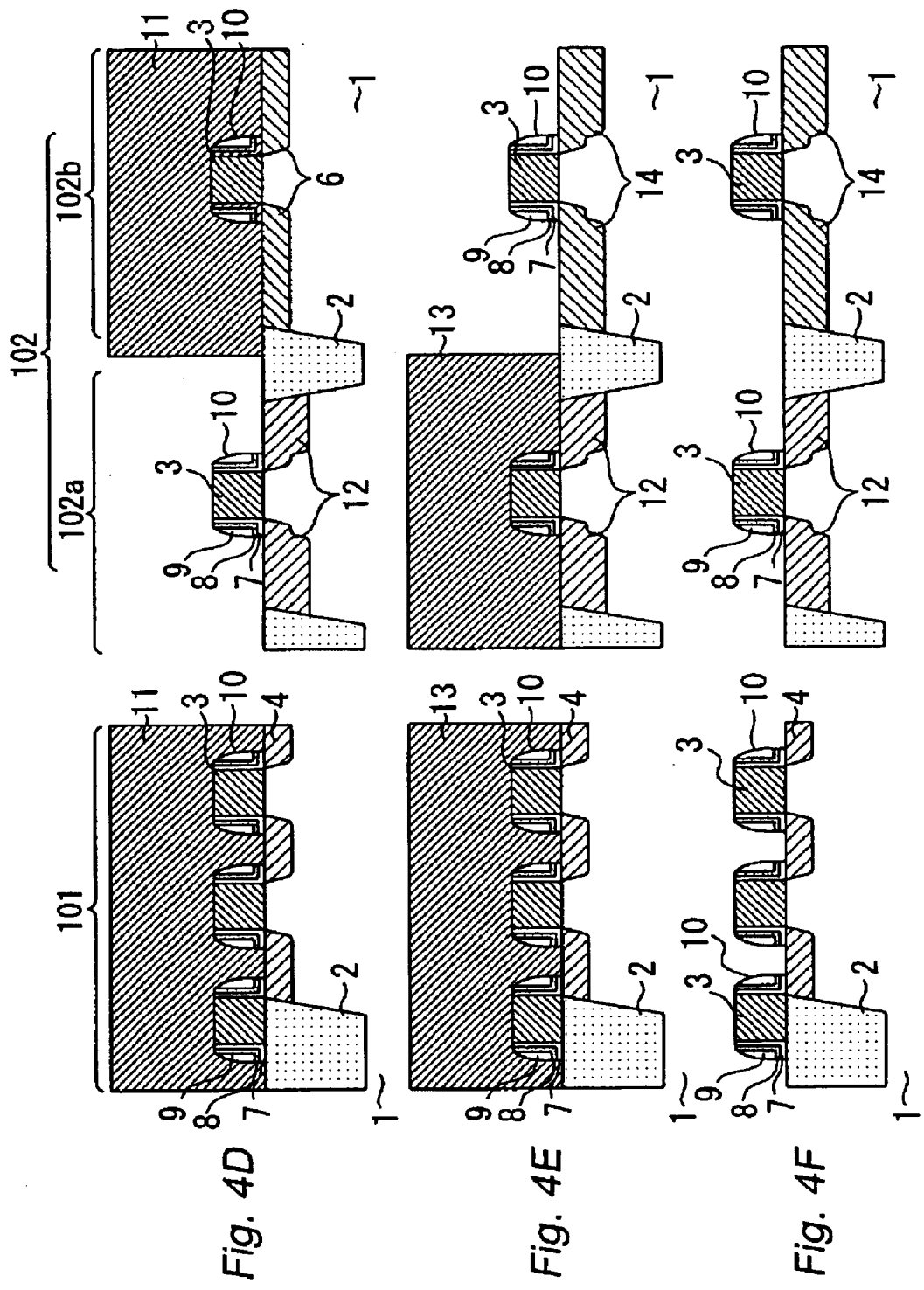

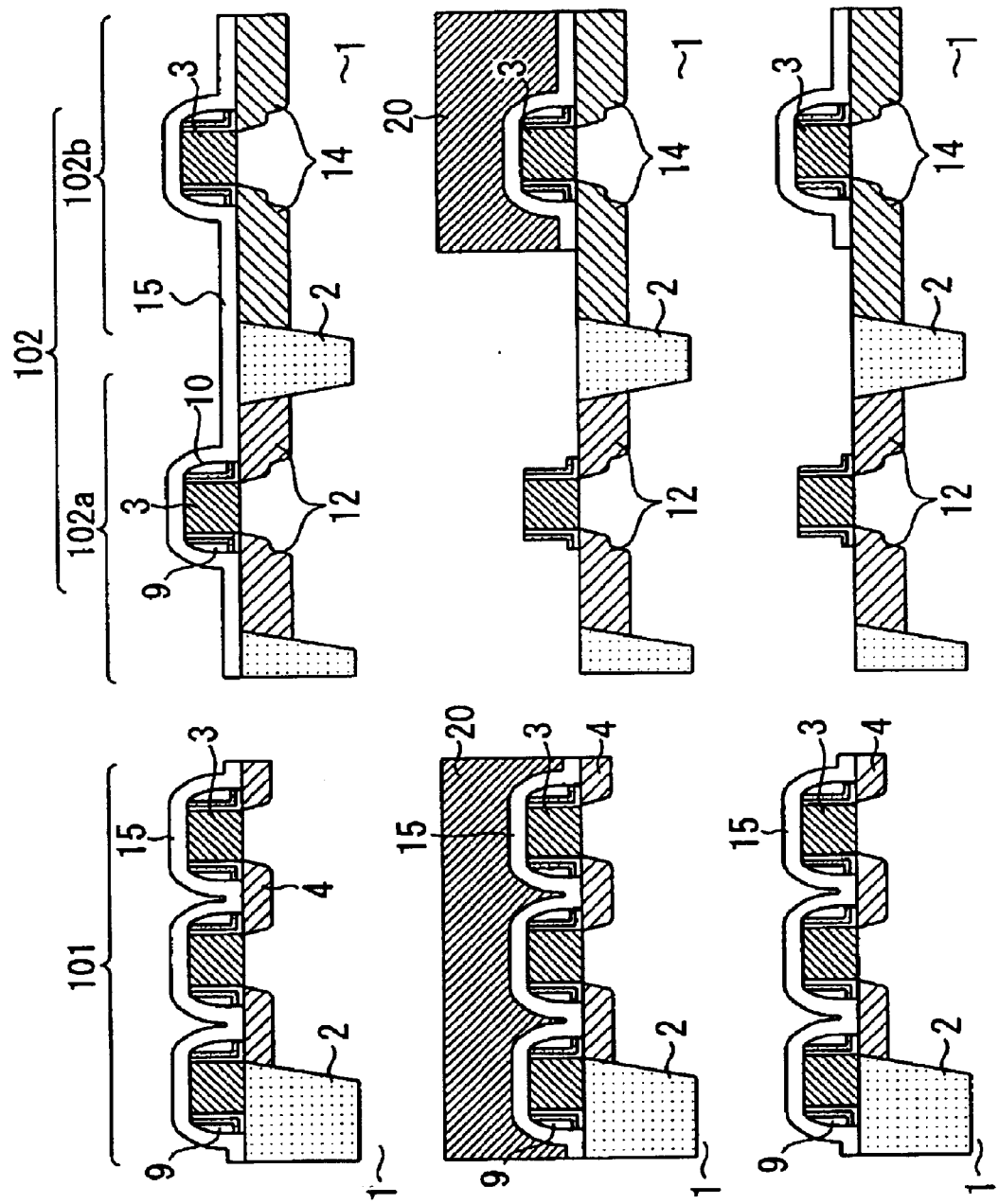

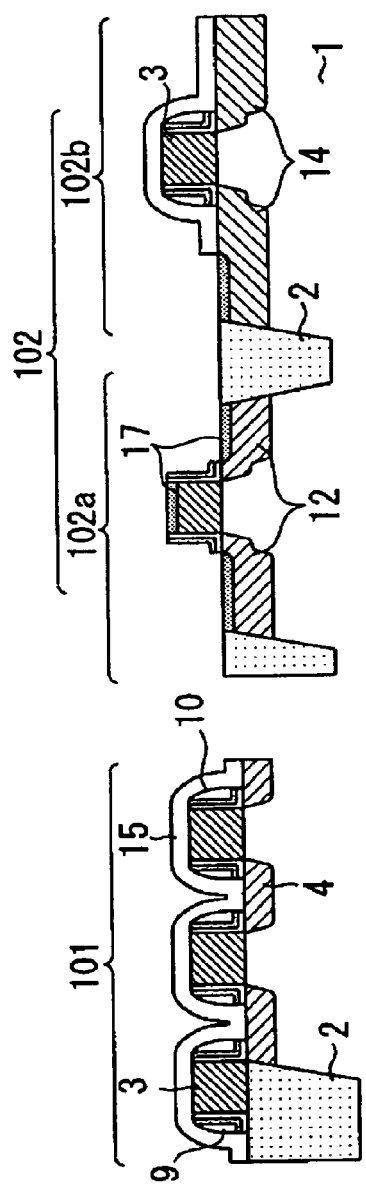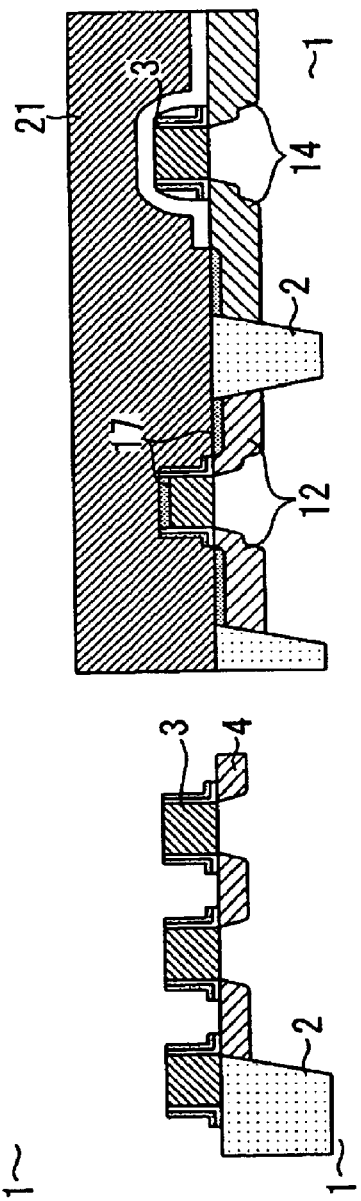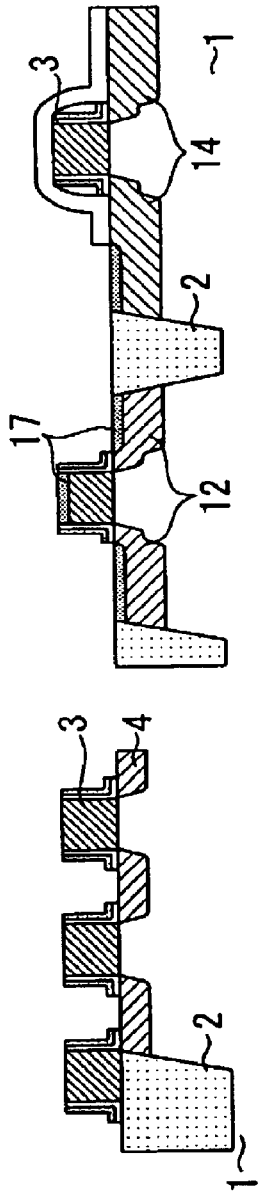
Fig. 4J
Fig. 4K
Fig. 4L

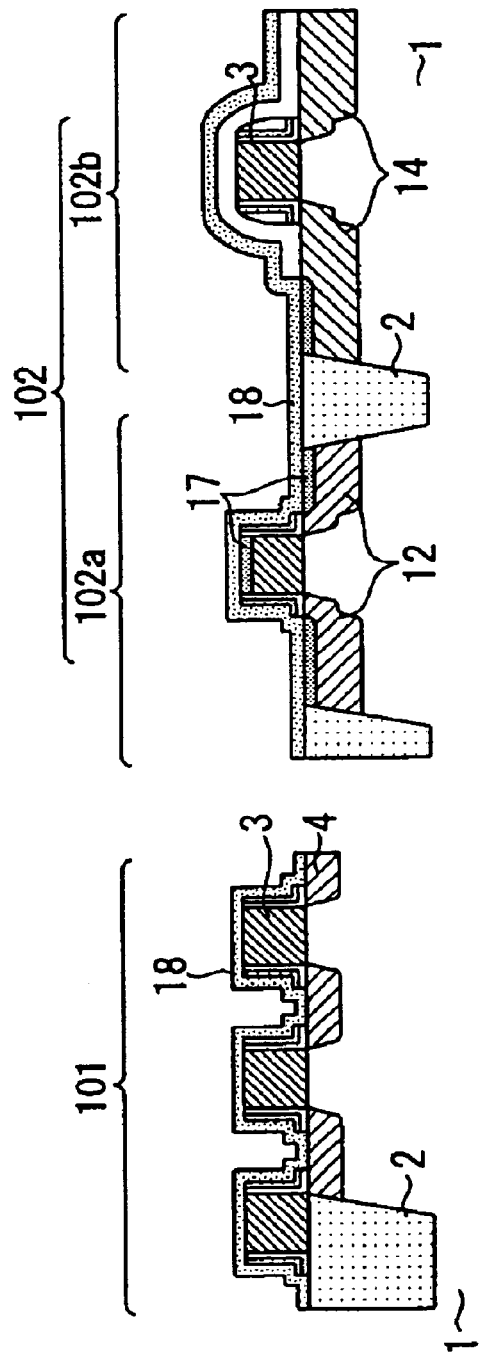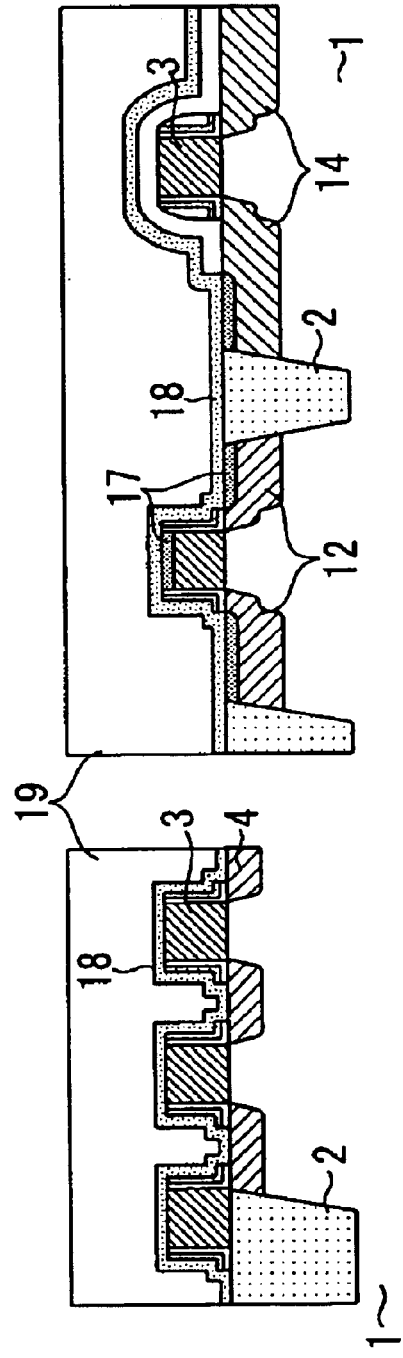

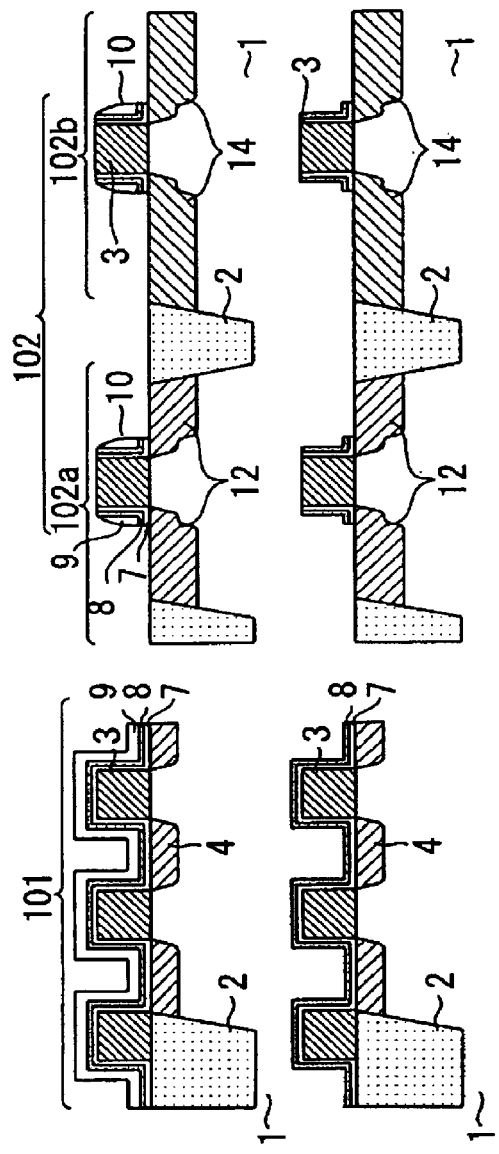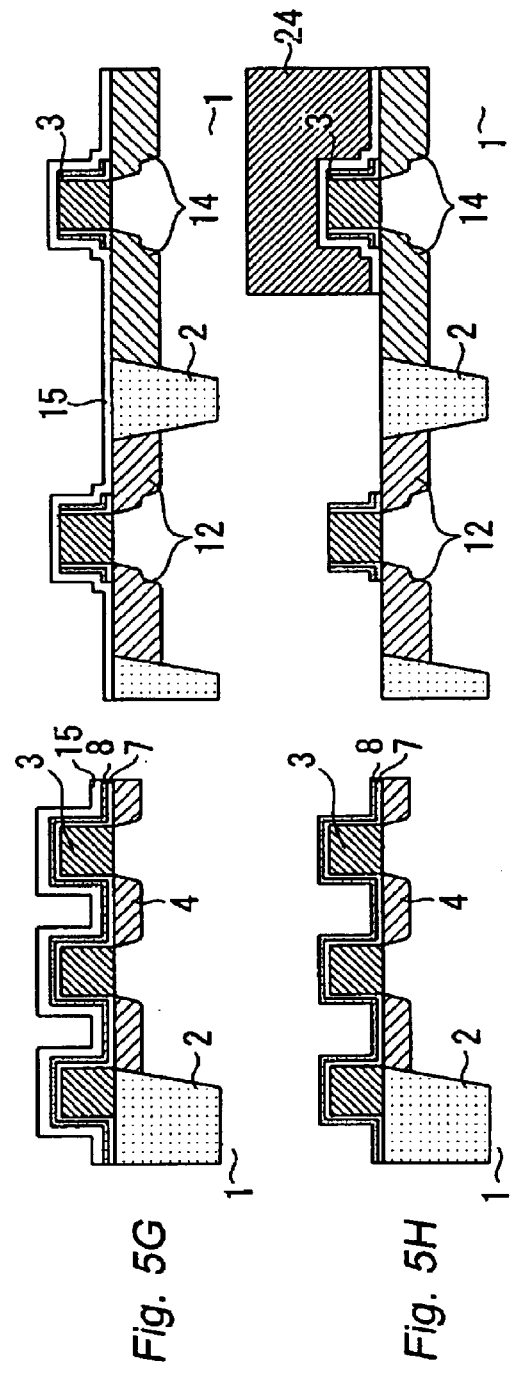

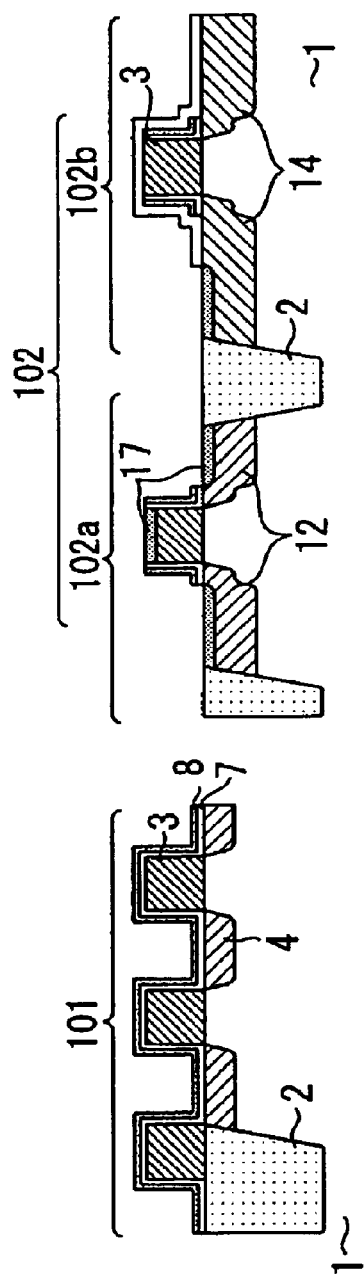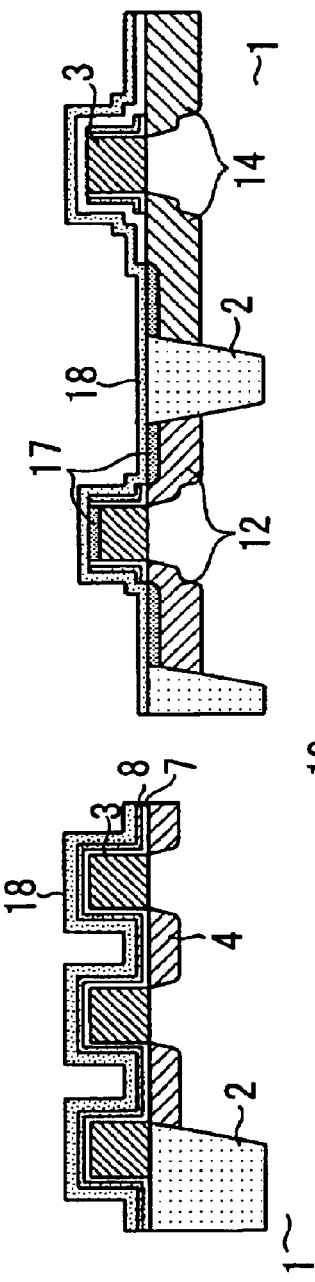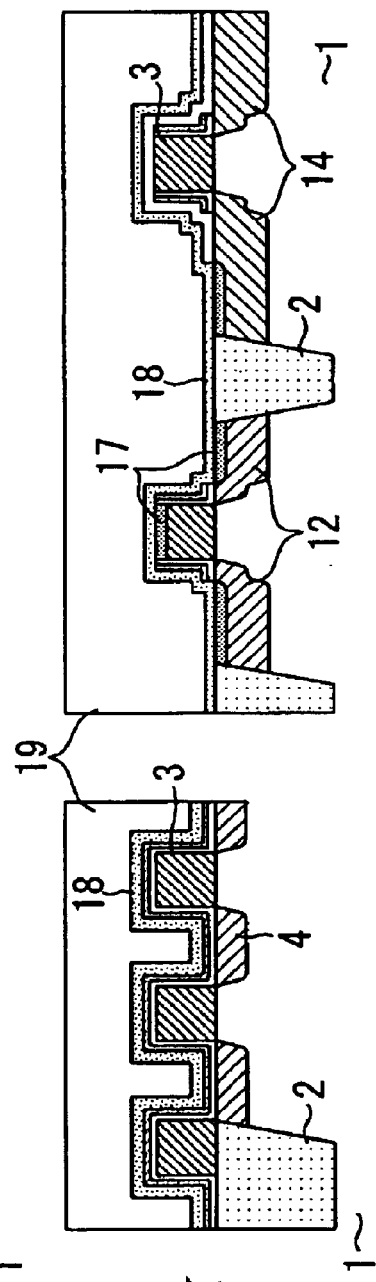
Fig. 5I
Fig. 5J
Fig. 5K

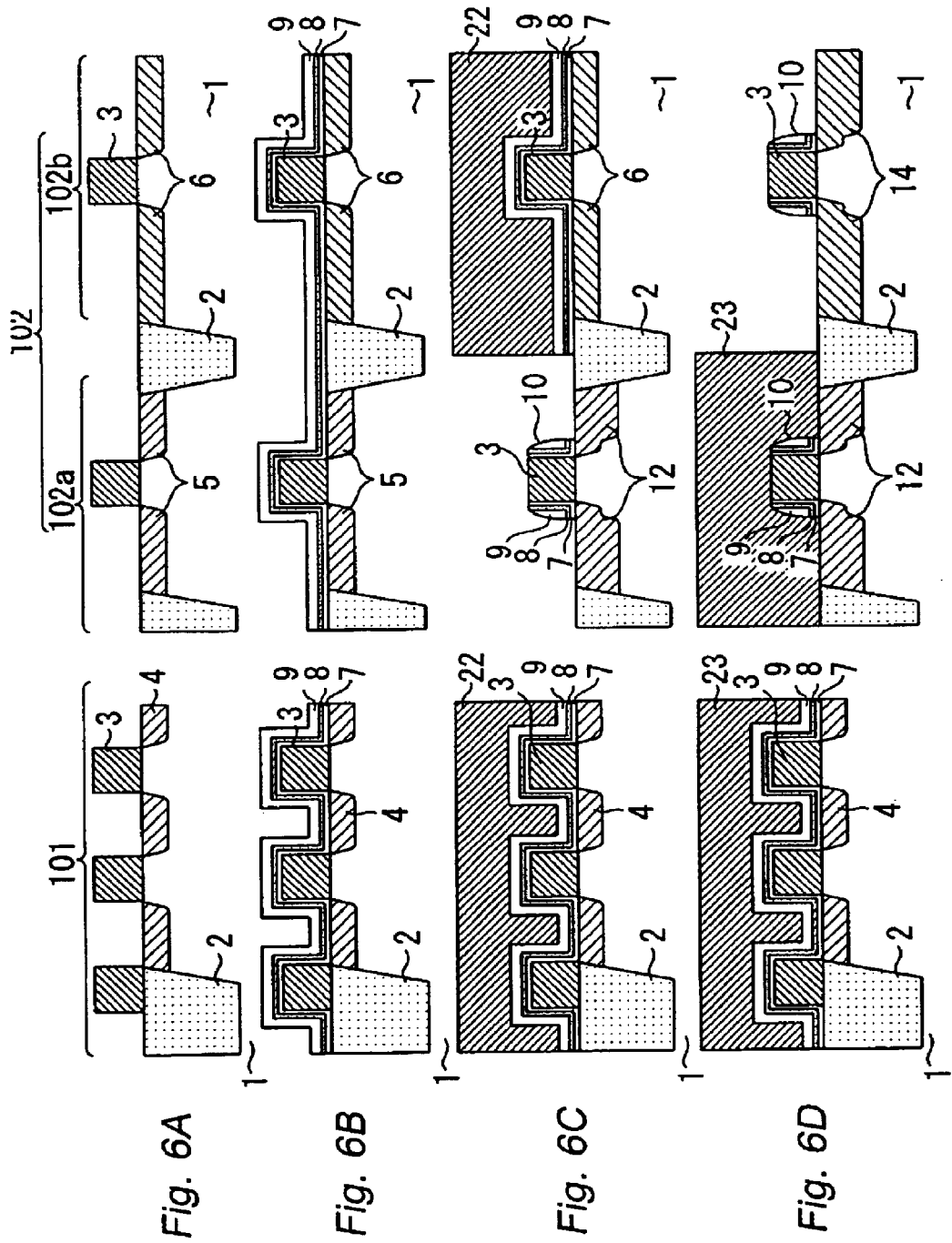

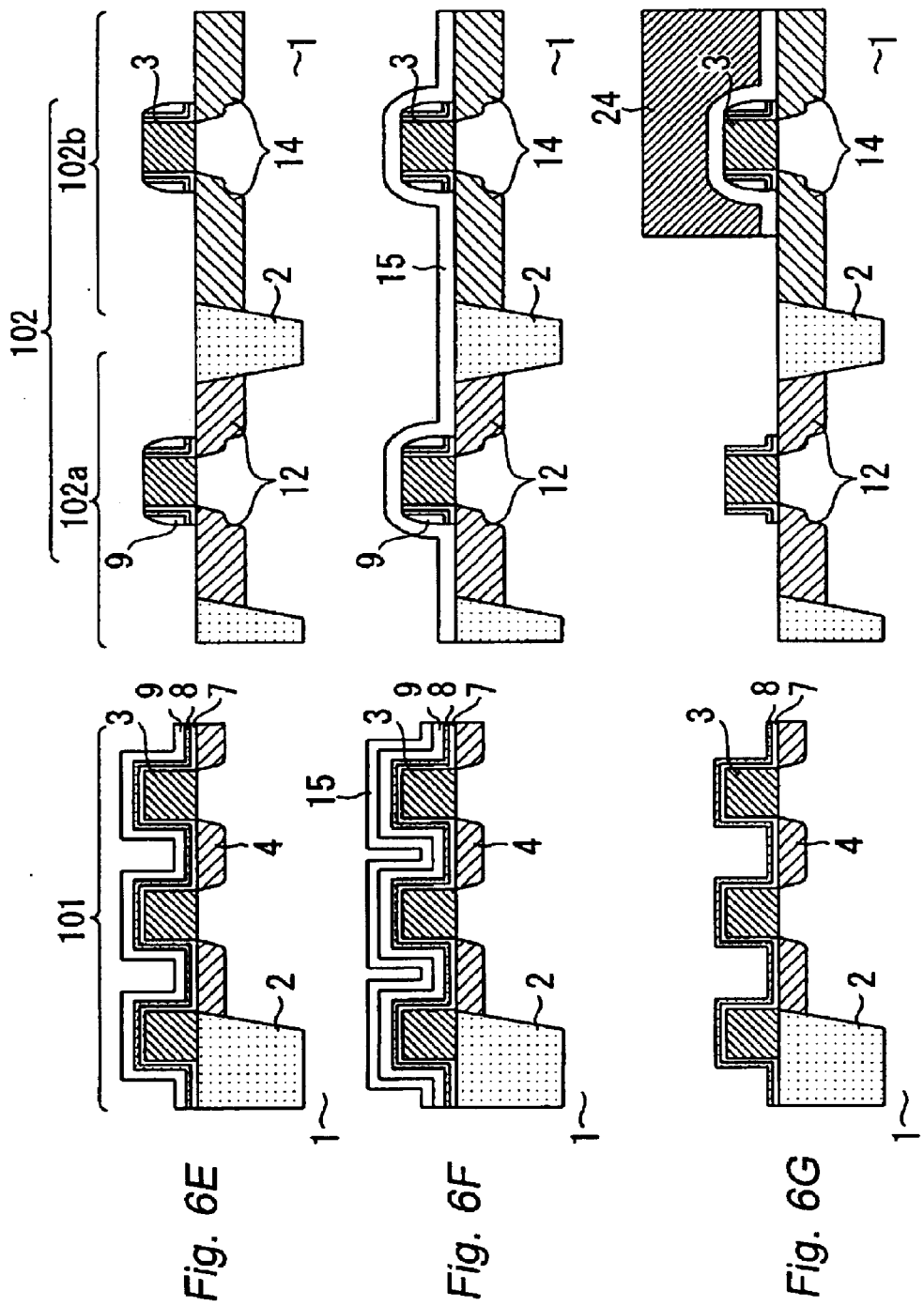

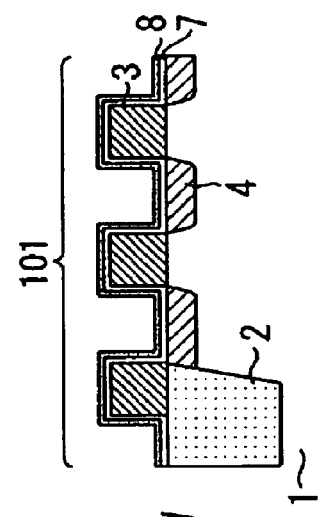
Fig. 6H
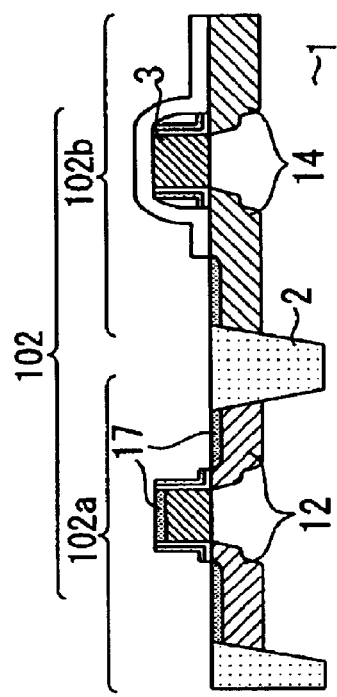
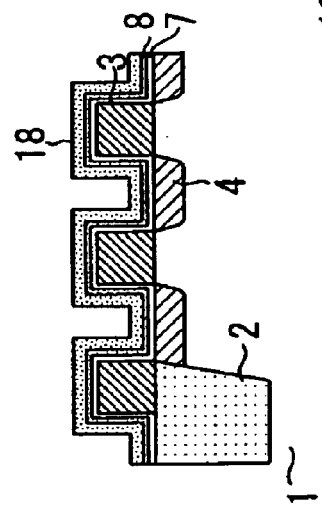
Fig. 6I
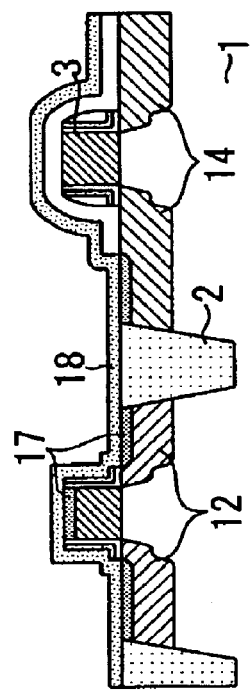
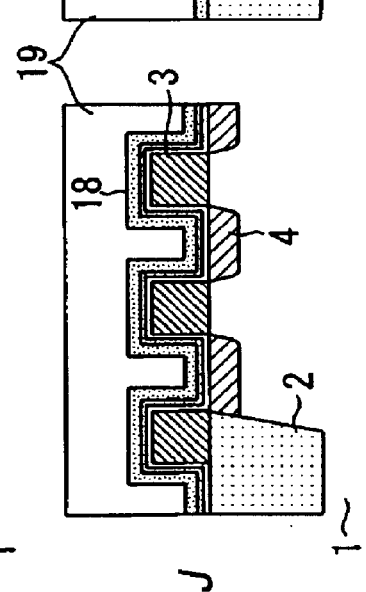
Fig. 6J
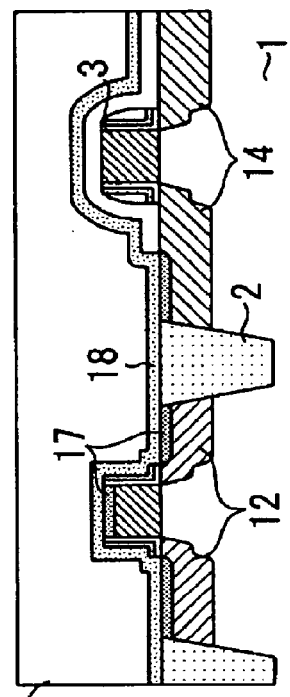

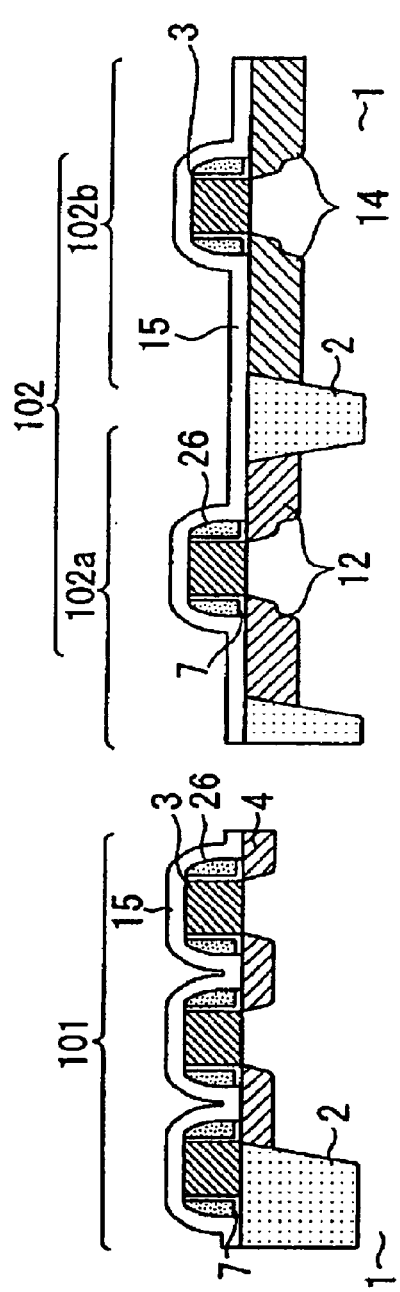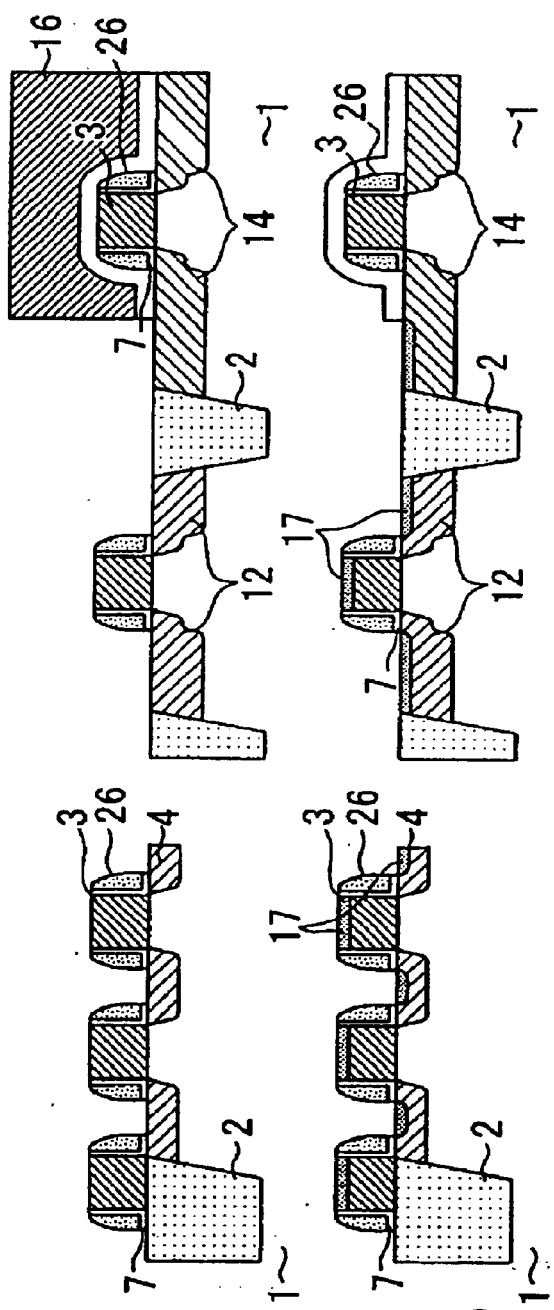
Fig. 7G (PRIOR ART)
Fig. 7H (PRIOR ART)
Fig. 7I (PRIOR ART)

METHOD FOR MANUFACTURING SEMICONDUCTOR DEVICE AND SEMICONDUCTOR DEVICE MANUFACTURED THEREBY

BACKGROUND OF THE INVENTION

1. Field of the Invention

The present invention relates to a method of manufacturing a semiconductor device. More particularly, the present invention relates to the formation of a transistor having an LDD structure and to the subsequent deposition of an interlayer dielectric.

2. Description of the Background Art

A system LSI (hereinafter called a DRAM-mixed device) mixed with a DRAM and a logic LSI has heretofore been manufactured. In a process for manufacturing the DRAM-mixed device, a transistor having an LDD structure and a transistor having a salicide structure have suitably been formed.

A conventional method of manufacturing a semiconductor device will be described below.

FIGS. 7A through 7K are cross-sectional views for describing a conventional method of manufacturing a semiconductor device.

As shown in FIG. 7A, an element isolating oxide film 2 is first formed on a semiconductor substrate 1. Here, the semiconductor substrate 1 has a DRAM area 101 and a logic area 102. The logic area 102 has a first logic area 102a and a second logic area 102b. An Nch transistor is formed in the first logic area 102a, and a Pch transistor is formed in the second logic area 102b.

Next, gate electrodes 3 each comprised of a gate oxide film and a polysilicon film are formed on the semiconductor substrate 1.

An n-type impurity is implanted in the DRAM area 101 and the first logic area 102a of the semiconductor substrate 1 in low concentrations to thereby form N-type source/drain regions 4 and 5 respectively. Further, a p-type impurity is implanted in the second logic area 102b in low concentrations to thereby form P-type source/drain regions 6.

Next, as shown in FIG. 7B, a silicon oxide film 7 is formed on the whole surface of the semiconductor substrate 1, and a silicon nitride film 25 is formed on the silicon oxide film 7.

Next, as shown in FIG. 7C, the silicon nitride film 25 and the silicon oxide film 7 are anisotropically etched to thereby form sidewalls 26 on the sides of the gate electrodes 3 respectively.

Next, as shown in FIG. 7D, resist patterns 11, which cover areas other than the first logic area 102a, are formed by a photolithography technique. Further, $N^+$ source/drain regions 12 are formed by implanting an n-type impurity in the first logic area 102a in high concentrations. Afterwards, the resist patterns 11 are removed.

Next, as shown in FIG. 7E, resist patterns 13, which cover ones other than the second logic area 102b, are formed by the photolithography technique. Further, $P^+$ source/drain regions 14 are formed by implanting a p-type impurity in the second logic area 102b in high concentrations.

Then, as shown in FIG. 7F, the resist patterns 13 are removed. Thus, a transistor having an LDD structure is formed in the logic area 102.

Next, as shown in FIG. 7G, a silicon oxide film, which serves as a salicide protection film 15, is formed on the entire surface of the semiconductor substrate 1.

Subsequently, as shown in FIG. 7H, a resist pattern 16, which covers the second logic area 102b, is formed by the photolithography technique. The salicide protection film 15 formed in each of the DRAM area 101 and the first logic area 102a is removed by wet etching with the resist pattern 16 as a mask. Thereafter, the resist pattern 16 is removed.

Next, a metal film, which has high melting-point, such as Co (cobalt) or the like is formed over the entire surface of the semiconductor substrate 1. The semiconductor substrate 1 is heat-treated (annealed) at a high temperature. Further, the unnecessary metal films are removed. Thus, metal silicide films 17 having high melting-point are formed as shown in FIG. 7I.

Next, as shown in FIG. 7J, a silicon nitride film 18, which serves as an etching stopper for SAC (Self Align Contact) formation, is formed over the entire surface of the semiconductor substrate 1.

Finally, as shown in FIG. 7K, a silicon oxide film used as an interlayer dielectric 19 is formed on the silicon nitride film 18, and thereafter the semiconductor substrate 1 is heat-treated (annealed).

In the aforementioned conventional method of manufacturing a semiconductor device, however, the sidewalls each having a predetermined thickness are formed even on the sides of the gate electrodes 3 in the DRAM area 101 to form the transistor having the LDD structure in the logic area 102. Therefore, a problem arises in that the interval between the gate electrodes 3 adjacent to one another in the DRAM area 101 becomes narrow. Further, since it is necessary to form the silicon nitride film 18 for the SAC formation after the formation of the sidewalls, the interval between the adjacent gate electrodes 3 is further narrowed.

Further, a problem arises in that when the interval between the gate electrodes 3 is narrow as described above, the interlayer dielectric 19 cannot be embedded between the gate electrodes 3 with no space. Therefore, the present method is accompanied by the problem that cavities 27 are defined between the respective gate electrodes 3 in the DRAM 101 as shown in FIG. 7K.

While the contact holes each extending from the surface of the interlayer dielectric 19 to the surface of the semiconductor substrate 1 lying between the gate electrodes 3 are formed on a self-alignment basis after the deposition of the interlayer dielectric 19, the following problems have been posed due to the cavities 27.

A problem arises in that since the cavities extend frontward or in their deep directions in FIG. 7K, the contacts adjacent to one another frontward or in their deep directions are short-circuited. Thus, the semiconductor device (DRAM-mixed device) manufactured by the conventional manufacturing method is accompanied by a problem that a DRAM does not operation in the normal manner.

SUMMARY OF THE INVENTION

The present invention has been conceived to solve the previously-mentioned problems and a general object of the present invention is to provide a novel and useful method of manufacturing a semiconductor device, and is to a novel and useful semiconductor device manufactured by the method.

The above object of the present invention is attained by a following resist component and a following method for manufacturing a semiconductor device.

A more specific object of the present invention is to form an interlayer dielectric without any space even in an area in which the intervals between respective gate electrodes are narrow.

The above object of the present invention is attained by a following method of manufacturing a semiconductor device.

According to first aspect of the present invention, the method of manufacturing a semiconductor device having a first area, a second area and a third area on a semiconductor substrate comprises: a step of forming plurality of gate electrodes on the semiconductor substrate, each of the gate electrodes having a gate oxide film and a conductive film; a step of forming a first insulating film on the whole surface of the semiconductor substrate so as to cover the plurality of gate electrodes; a step of forming a second insulating film on the first insulating film; a step of forming sidewalls on the sides of the plurality of gate electrodes respectively by means of etching the first insulating film and the second insulating film, each of the sidewalls including a layer for the first insulating film covering the sides of the gate electrodes and a layer for the second insulating film covering the layer for the first insulating film; an impurity implanting step of implanting an impurity in the second area and the third area with the sidewalls as masks; a first removing step of removing the layer for the second insulating film formed on the sides of the gate electrodes after the impurity implanting step; a third insulating film forming step of forming a third insulating film on the whole surface of the semiconductor substrate after the first removing step; and an interlayer dielectric forming step of forming an interlayer dielectric on the third insulating film.

According to second aspect of the present invention, the method of manufacturing a semiconductor device having a first area, a second area and a third area on a semiconductor substrate comprises: a step of forming a plurality of gate electrodes on the semiconductor substrate, each of the gate electrodes having a gate oxide film and a conductive film; a step of forming a first insulating film on the whole surface of the semiconductor substrate so as to cover the gate electrodes; a second insulating film forming step of forming a second insulating film on the first insulating film; a step of forming first sidewalls on the sides of the plurality of gate electrodes respectively by means of etching the first insulating film and the second insulating film formed in the second area, each of the first sidewalls including a layer for the first insulating film covering the sides of the gate electrodes and a layer for the second insulating film covering the layer for the first insulating film; a first impurity implanting step of implanting an impurity in the second area with the first sidewalls as masks; a step of forming second sidewalls on the sides of the gate electrodes by means of etching the first insulating film and the second insulating film formed in the third area, the second sidewalls including a layer for the first insulating film covering the sides of the gate electrodes and a layer for the first insulating film; a second impurity implanting step of implanting an impurity in the third area with the second sidewalls as masks; a first removing step of removing the second insulating film formed in the first area and the layer for the second insulating film formed in the first area and the second area after the first impurity implanting step and the second impurity implanting step; a third insulating film forming step of forming a third insulating film on the whole surface of the semiconductor substrate after the first removing step; and an interlayer dielectric forming step of forming an interlayer dielectric on the third insulating film.

According to third aspect of the present invention, the method of manufacturing a semiconductor device comprises: a step of forming a plurality of gate electrodes on a semiconductor substrate, each of the gate electrodes having a gate oxide film and a conductive film; a step of forming a first insulating film on the whole surface of the semiconductor substrate so as to cover the gate electrodes; a step of forming a second insulating film on the first insulating film; a step of forming sidewalls on the sides of the gate electrodes respectively by means of etching the first insulating film and the second insulating film, each of the sidewalls including a layer for the first insulating film covering the sides of the gate electrodes and a layer for the second insulating film covering the layer for the first insulating film; a step of implanting an impurity in the semiconductor substrate with the sidewalls as masks; a step of removing the layer for the second insulating film formed on the sides of the gate electrodes after the impurity implanting step; a step of forming a third insulating film on the whole surface of the semiconductor substrate after the removing step; a step of forming an interlayer dielectric on the third insulating film; and a step of forming contact holes on a self-alignment basis with the third insulating film as an etching stopper, each of contact holes extending from the surface of the interlayer dielectric to the surface of the semiconductor substrate and being placed between the gate electrodes.

Other objects and further features of the present invention will be apparent from the following detailed description when read in conjunction with the accompanying drawings.

BRIEF DESCRIPTION OF THE DRAWINGS

FIGS. 1A through 1L are cross-sectional views for describing a method of manufacturing a semiconductor device according to a first embodiment of the present invention;

FIGS. 2A through 2K are cross-sectional views for describing a method of manufacturing a semiconductor device according to a second embodiment of the present invention;

FIGS. 3A through 3O are cross-sectional views for describing a method of manufacturing a semiconductor device according to a third embodiment of the present invention;

FIGS. 4A through 4N are cross-sectional views for describing a method of manufacturing a semiconductor device according to a fourth embodiment of the present invention;

FIGS. 5A through 5K are cross-sectional views for describing a method of manufacturing a semiconductor device according to a fifth embodiment of the present invention;

FIGS. 6A through 6J are cross-sectional views for describing a method of manufacturing a semiconductor device according to a sixth embodiment of the present invention;

FIGS. 7A through 7K are cross-sectional views for describing a conventional method of manufacturing a semiconductor device.

DETAILED DESCRIPTION OF THE PREFERRED EMBODIMENTS

Figures 1A, 1B, 1C:
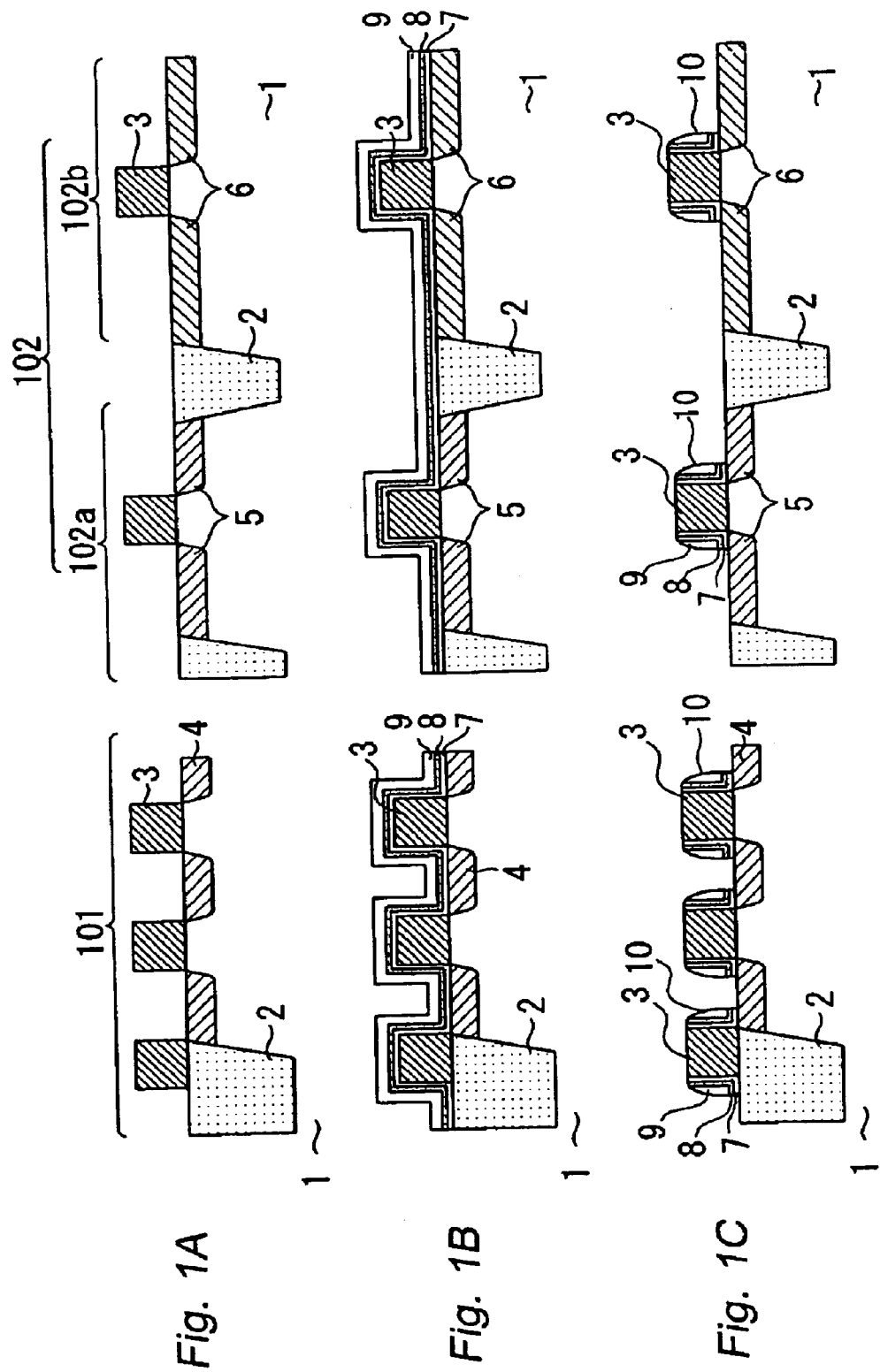

In the following, principles and embodiments of the present invention will be described with reference to the accompanying drawings. The members and steps that are common to some of the drawings are given the same reference numerals and redundant descriptions therefore may be omitted.

First Embodiment

FIGS. 1A through 1L are cross-sectional views for describing a method of manufacturing a semiconductor device according to a first embodiment of the present invention.

The method of manufacturing a semiconductor device according to the present first embodiment will be explained below with reference to FIGS. 1A through 1L.

As shown in FIG. 1A, an element isolating oxide film 2 is first formed on a semiconductor substrate 1. Here, the semiconductor substrate 1 has a DRAM area 101 and a logic area 102. The logic area 102 has a first logic area 102a and a second logic area 102b. As will be described below, an Nch transistor is formed in the first logic area 102a and a Pch transistor is formed in the second logic area 102b respectively. Further, the DRAM area 101 is an area in which each memory cell for DRAM is formed.

Next, a plurality of gate electrodes 3 each having a gate oxide film, and a conductive film such as a doped polysilicon film or the like are formed on the semiconductor substrate 1.

An n-type impurity is implanted in the DRAM area 101 and first logic area 102a of the semiconductor substrate 1 in low concentrations with each gate electrode 3 as a mask. Thus, N-type source/drain regions 4 and 5 are respectively formed on both sides of the gate electrodes 3 in the same areas 101 and 102a.

Further, a p-type impurity is implanted in the second logic area 102b of the semiconductor substrate 1 in low concentrations with each gate electrode 3 as a mask. Thus, P-type source/drain regions 6 are formed at the sides of the gate electrode 3 in the second logic area 102b.

Next, as shown in FIG. 1B, a silicon oxide film 7 is formed over the whole surface of the semiconductor substrate 1 so as to cover the gate electrodes 3, and a silicon nitride film 8 is formed on the silicon oxide film 7. Here, the silicon oxide film 7 is formed to improve a hot carrier (also called "hot electron") characteristic of a transistor (which will be described later).

Further, a silicon oxide film 9 is formed on the silicon nitride film 8. Here, the silicon oxide film 9 may preferably be a silicon oxide film which contains either boron or phosphor or both thereof. This is done to enhance an etching rate of the silicon oxide film 9 by wet etching (it will be described later).

As shown in FIG. 1C, the silicon oxide film 9, the silicon nitride film 8 and the silicon oxide film 7 are anisotropically etched. Namely, the silicon oxide film 9, silicon nitride film 8 and silicon oxide film 7 formed other than the sides of the gate electrodes 3 are removed by dry etching. Thus, sidewalls 10 including the silicon nitride films 8 which cover the sides of each gate electrode 3, and the silicon oxide films 9 which cover the silicon nitride films 8, are formed on the sides of each gate electrode 3.

While the three types of insulating films 7, 8 and 9 are stacked or layered on the sides of the gate electrodes 3 respectively. Of these, ones, which essentially function as the sidewalls 10, are the silicon nitride film 8 and the silicon oxide film 9.

Therefore, in the present first embodiment, each of the sidewalls 10 will be defined as one obtained by stacking the silicon nitride film 8 and the silicon oxide film 9 (other embodiments to be described later are similar to it).

Further, the silicon oxide film 7 is integrally formed on the sides of the gate electrodes 3 and the semiconductor substrate 1. The hot carrier characteristic of the transistor is improved owing to the silicon oxide film 7. Described in details, the occurrence of a hot carrier phenomenon in the vicinity of each bent portion of the silicon oxide film 7 can be prevented.

Next, as shown in FIG. 1D, resist patterns 11, which cover areas other than the first logic area 102a, are formed by a photolithography technique. Further, N⁺ source/drain regions 12 are formed by implanting an n-type impurity in the first logic area 102a in high concentrations with the sidewalls 10 as masks. Afterwards, the resist patterns 11 are removed.

Next, as shown in FIG. 1E, resist patterns 13, which cover areas other than the second logic area 102b, are formed by the photolithography technique. Further, P⁺ source/drain regions 14 are formed by implanting a p-type impurity in the second logic area 102b in high concentrations with the sidewalls 10 as masks.

Then, the resist patterns 13 are removed as shown in FIG. 1F. Thus, a transistor having an LDD structure is formed in the logic area 102.

Figures 1G, 1H, 1I:
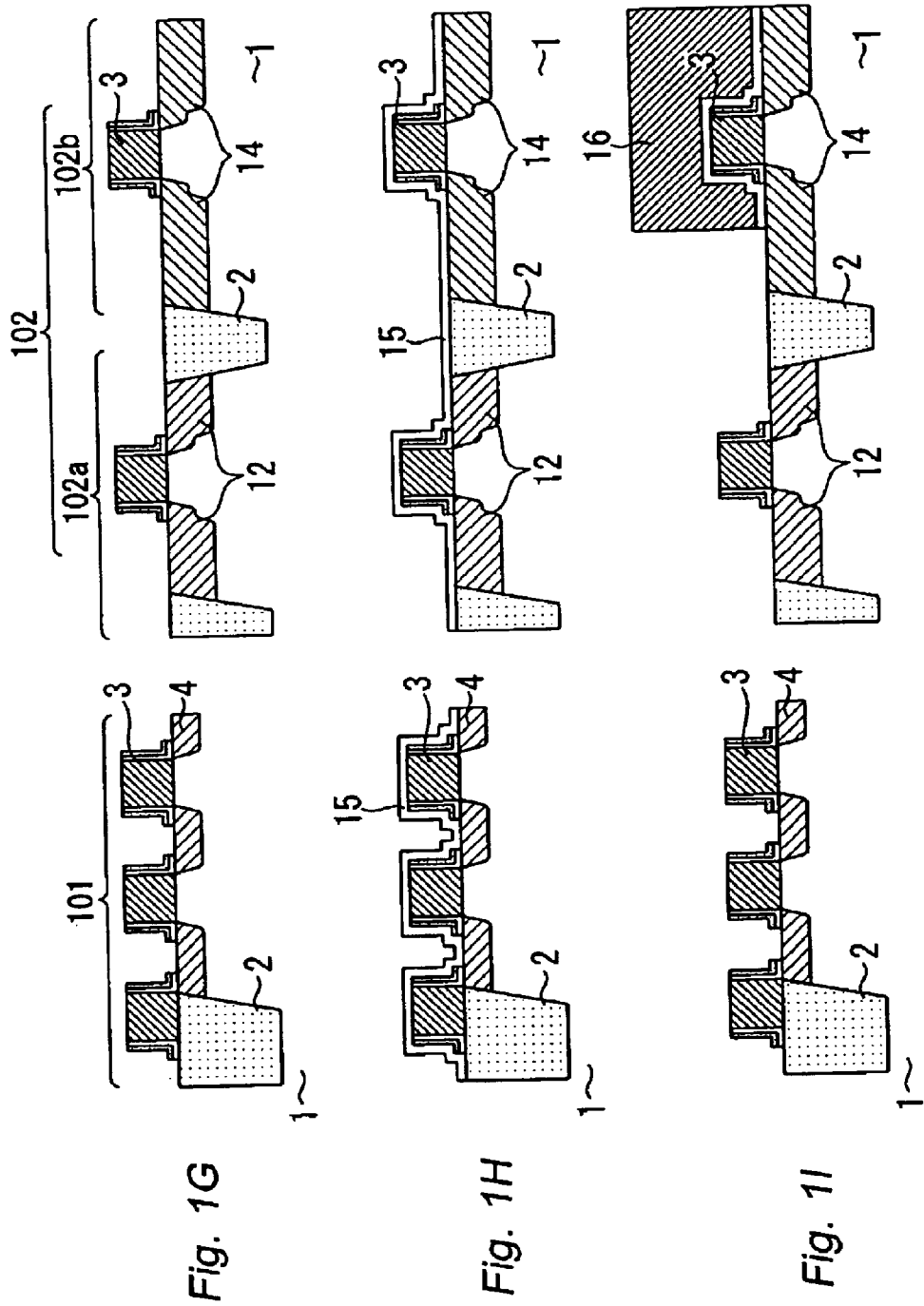

Next, as shown in FIG. 1G, the silicon oxide films 9 formed on the sides of the gate electrodes 3 are removed by wet etching. Namely, only the silicon oxide films 9 of the sidewalls 10 formed on the sides of the gate electrodes 3 are removed by wet etching.

Thus, the interval between the adjacent gate electrodes 3 is enlarged by the thicknesses of the silicon oxide films 9. This is particularly effective for the DRAM area 101 in which the intervals between the respectively gate electrodes 3 are dense.

As described above, the silicon oxide film 9 contains either boron or phosphor or both thereof. Therefore, the etching rate of the silicon oxide film 9 is faster than that of the element isolating oxide film 2 composed of a non-doped silicon oxide film upon wet etching. Thus, when the silicon oxide films 9 are removed by wet etching, the depression (film decrease) in the element isolating oxide film 2 can be reduced.

Next, as shown in FIG. 1H, a silicon oxide film, which serves as a salicide protection film 15, is formed over the entire surface of the semiconductor substrate 1.

Next, as shown in FIG. 1I, a resist pattern 16, which covers the second logic area 102b, is formed by the photolithography technique. The salicide protection film 15 formed in each of the DRAM area 101 and the first logic area 102a is removed by wet etching. Thereafter, the resist pattern 16 is removed.

Next, as shown in FIG. 1J, metal silicide films 17 are formed by a salicide (Self-Aligned Silicide) method. Namely, a transistor having a salicide structure is formed.

Described specifically, a metal film having high melting-point such as Co (cobalt), Ti (titanium), W (tungsten), Mo (molybdenum), Ta (tantalum) is first formed over the entire surface of the semiconductor substrate 1. Next, the semiconductor substrate 1 is heat-treated (annealed) at a high temperature. Further, the unnecessary (unreacted) metal film is removed. Thus, as shown in FIG. 1J, a metal silicide film 17 having high melting-point is formed on each of upper layers of the gate electrodes 3 formed in the DRAM area 101 and the first logic area 102a, and impurity-diffused regions 4 and 12 adjacent to the silicon nitride films 8 formed on the sides of these gate electrodes 3.

Next, as shown in FIG. 1K, a silicon nitride film 18, which serves as an etching stopper for SAC (Self Align Contact) formation is formed over the entire surface of the semiconductor substrate 1.

Next, as shown in FIG. 1L, a silicon oxide film used as an interlayer dielectric 19 is formed on the silicon nitride film 18, and thereafter the semiconductor substrate 1 is heat-treated (annealed).

Next, although not shown, contact holes, each of which extends from the surface of the interlayer dielectric 19 to the surface of the semiconductor substrate 1 and is placed between the adjacent gate electrodes 3, are formed on a self-aligned basis with the silicon nitride film 18 as the etching stopper. Further, a conductive film is embedded into the contact hole to thereby form a SAC.

As described above, in the method of manufacturing a semiconductor device according to the present first embodiment, the sidewalls 10, each of which includes the silicon nitride film 8 covering the sides of the gate electrodes 3 and the silicon oxide film 9 covering the silicon nitride film 8, are formed on the sides of the gate electrodes 3 respectively. After formation of the transistor having the LDD structure in the logic area 102, the silicon oxide film 9 formed on each of the sides of the gate electrodes 3 is removed by wet etching. Afterwards, the silicon nitride film 18 for SAC formation is formed, and the interlayer dielectric 19 is formed on the silicon nitride film 18.

According to the manufacturing method, the interval between the adjacent gate electrodes 3 is enlarged by the thicknesses of the removed silicon oxide films 9. Therefore, the interval between the gate electrodes 3 can be made wider than ever upon embedding of the interlayer dielectric 19. This is particularly effective for the DRAM area 101 in which the intervals between the respective gate electrodes 3 are dense.

Thus, the interlayer dielectric 19 can be embedded between the gate electrodes 3 with no space without defining the cavities as in the prior art. Namely, the interlayer dielectric 19 can be embedded even in the area 101 in which the intervals between the gate electrodes 3 are narrow, without any space.

Therefore, the contacts formed after the formation of the interlayer dielectric 19 can be prevented from being short-circuited due to the cavities. It is thus possible to manufacture a high-quality semiconductor device (DRAM-mixed device).

Further, the silicon oxide film doped with either boron or phosphor or both thereof is used as the silicon oxide film 9 removed by wet etching. Here, the etching rate of the silicon oxide film 9 doped with the impurity is faster than that of the non-doped silicon oxide film like the element isolating oxide film 2 upon wet etching. Therefore, when the silicon oxide films 9 is wet-etched, the depression in the element isolating oxide film 2 can be reduced, and the reliability of the semiconductor device can be enhanced.

Incidentally, while the present embodiment has described the method of manufacturing the semiconductor device having the DRAM area 101 and the logic area 102, the logic area 102 may be an area in which a DRAM peripheral circuit having a similar structure is formed (other embodiments to be described later are similar).

While the transistor having the LDD structure has been formed in the logic area 102 alone in the present first embodiment, a similar transistor may be formed even in the DRAM area 101. Even in this case, the present invention can be applied thereto.

Second Embodiment

FIGS. 2A through 2K are cross-sectional views for describing a method of manufacturing a semiconductor device according to a second embodiment of the present invention.

The method of manufacturing a semiconductor device according to the second embodiment will be described below with reference to FIGS. 2A through 2K. Incidentally, the description of the same process steps as the aforementioned first embodiment will be omitted in the present second embodiment.

Since steps shown in FIGS. 2A through 2F are identical to the steps shown in FIGS. 1A through 1F employed in the first embodiment, their description will be omitted.

Subsequently to these steps, as shown in FIG. 2G, a silicon oxide film, which serves as a salicide protection film 15, is formed over the entire surface of a semiconductor substrate 1.

Next, as shown in FIG. 2H, a resist pattern 16, which covers a second logic area 102*b*, is formed by a photolithography technique.

Further, the salicide protection film 15 formed in each of a DRAM area 101 and a first logic area 102*a* is removed by wet etching with the resist pattern 16 as a mask, and a silicon oxide film 9 formed on each of the sides of gate electrodes 3 in the same areas 101 and 102 is removed at the same time.

Afterwards, the resist pattern 16 is removed.

Next, as shown in FIG. 2I, metal silicide films 17 are formed by a method (salicide method) similar to the first embodiment. Further, as shown in FIG. 2J, a silicon nitride film 18 is formed over the entire surface of the semiconductor substrate 1. Further, an interlayer dielectric 19 is formed on the silicon nitride film 18 as shown in FIG. 2K.

Next, although not shown, contact holes, each of which extends from the surface of the interlayer dielectric 19 to the surface of the semiconductor substrate 1 and is placed between the adjacent gate electrodes 3, are formed on a self-aligned basis with the silicon nitride film 18 as the etching stopper. Further, a conductive film is embedded into the contact hole to thereby form a SAC.

As described above, even in the method of manufacturing a semiconductor device according to the present second embodiment, sidewalls 10, each of which includes the silicon nitride film 8 covering the sides of the gate electrodes 3 and the silicon oxide film 9 covering the silicon nitride film 8, are formed on the sides of the gate electrodes 3 respectively. After formation of a transistor having an LDD structure in the logic area 102, the silicon oxide film 9 formed on each of the sides of the gate electrodes 3 is removed by wet etching. Afterwards, the silicon nitride film 18 for SAC formation is formed, and the interlayer dielectric 19 is formed on the silicon nitride film 18.

According to the manufacturing method, the interval between the adjacent gate electrodes 3 is enlarged by the thicknesses of the removed silicon oxide films 9. Accordingly, an effect similar to the first embodiment can be obtained.

In the present second embodiment, the salicide protection film 15 and the silicon oxide film 9 formed on each of the sides of the gate electrodes 3 are removed by one wet etching. Therefore, the number of steps can be reduced as compared with the manufacturing method according to the first embodiment. It is thus possible to reduce the manufacturing cost of the semiconductor device.

Third Embodiment

FIGS. 3A through 3O are cross-sectional views for describing a method of manufacturing a semiconductor device according to a third embodiment of the present invention.

The method of manufacturing a semiconductor device according to the third embodiment will be described below with reference to FIGS. 3A through 3O. Incidentally, the description of the same process steps as the aforementioned first embodiment will be omitted in the present third embodiment.

Since steps shown in FIG. 3A through 3H are identical to the steps shown in FIG. 1A through 1H employed in the first embodiment, their description will be omitted.

Subsequently to these steps, as shown in FIG. 3I, resist patterns 20, which cover areas other than a first logic area 102*a*, are formed by a photolithography technique. Next, a salicide protection film 15 formed in the first logic area 102a is removed by wet etching with the resist pattern 20 as a mask.

Next, the resist patterns 20 are removed as shown in FIG. 3J.

Next, as shown in FIG. 3K, metal silicide films 17 having high melting-point are formed in the first logic area 102a by using a method (salicide method) similar to the first embodiment. Since, at this time, a DRAM area 101 is covered with the salicide protection film 15, no metal silicide films 17 are formed therein.

Next, as shown in FIG. 3L, a resist pattern 21, which covers areas other than the DRAM area 101, is formed by a photolithography technique. Next, the salicide protection film 15 formed in the DRAM area 101 is removed by wet etching with the resist pattern 21 as a mask.

Further, the resist pattern 21 is removed as shown in FIG. 3M.

Next, as shown in FIG. 3N, a silicon nitride film 18 is formed over the entire surface of a semiconductor substrate 1 by a method similar to the first embodiment. Further, an interlayer dielectric 19 is formed on the silicon nitride film 18 as shown in FIG. 3O.

Next, although not shown, contact holes, each of which extends from the surface of the interlayer dielectric 19 to the surface of the semiconductor substrate 1 and is placed between the adjacent gate electrodes 3, are formed on a self-aligned basis with the silicon nitride film 18 as the etching stopper. Further, a conductive film is embedded into the contact hole to thereby form a SAC.

As described above, in the method of manufacturing a semiconductor device according to the present third embodiment, sidewalls 10, each of which includes the silicon nitride film 8 covering the sides of the gate electrodes 3 and the silicon oxide film 9 covering the silicon nitride film 8, are formed on the sides of the gate electrodes 3 respectively. After formation of a transistor having an LDD structure in a logic area 102, the silicon oxide film 9 formed on each of the sides of the gate electrodes 3 is removed by wet etching. Afterwards, the silicon nitride film 18 for SAC formation is formed over the entire surface of the semiconductor substrate 1, and the interlayer dielectric 19 is formed on the silicon nitride film 18.

According to the manufacturing method, the interval between the adjacent gate electrodes 3 in the DRAM area 101 is enlarged by the thicknesses of the removed silicon oxide films 9. Thus, an effect similar to the first embodiment can be obtained.

In the present third embodiment, the salicide protection film 15 has been left in the DRAM area 101 when the metal silicide films 17 are formed in the first logic area 102a (see FIG. 3K). Therefore, no metal silicide films 17 are formed in the DRAM area 101, and hence a junction leak current produced from source/drain regions 4 can be reduced. Accordingly, a high refresh characteristic of a DRAM can be obtained as compared with the embodiments 1 and 2.

Fourth Embodiment

FIGS. 4A through 4N are cross-sectional views for describing a method of manufacturing a semiconductor device according to a fourth embodiment of the present invention.

The method of manufacturing the semiconductor device, according to the fourth embodiment will be described below with reference to FIGS. 4A through 4N. Incidentally, the description of the same process steps as the aforementioned first embodiment will be omitted in the present fourth embodiment.

Since steps shown in FIG. 4A through 4F are identical to the steps shown in FIG. 1A through FIG. 1F employed in the first embodiment, their description will be omitted.

Subsequently to these steps, a silicon oxide film serving as a salicide protection film 15 is formed over the entire surface of a semiconductor substrate 1 as shown in FIG. 4G.

Next, as shown in FIG. 4H, resist patterns 20, which cover areas other than a first logic area 102a, are formed by a photolithography technique.

The salicide protection film 15 formed in the first logic area 102a, and silicon oxide films 9 formed on the sides of a gate electrode 3 in the same area 102a are removed by wet etching with each resist pattern 20 as a mask.

Next, the resist patterns 20 are removed as shown in FIG. 4I.

Next, as shown in FIG. 4J, metal silicide films 17 having high melting-point are formed in the first logic area 102a by using a method (salicide method) similar to the first embodiment. Since, at this time, a DRAM area 101 is covered with the salicide protection film 15, no metal silicide films 17 are formed therein.

Next, as shown in FIG. 4K, a resist pattern 21, which covers areas other than the DRAM area 101, is formed by a photolithography technique.

The salicide protection film 15 formed in the DRAM area 101, and the silicon oxide films 9 formed on the sides of the gate electrodes 3 in the same area 101 are removed by wet etching with the resist pattern 21 as a mask.

Next, the resist pattern 21 is removed as shown in FIG. 4L.

Next, as shown in FIG. 4M, a silicon nitride film 18 is formed over the entire surface of the semiconductor substrate 1 by a method similar to the first embodiment. Further, an interlayer dielectric 19 is formed on the silicon nitride film 18 as shown in FIG. 4N.

Next, although not shown, contact holes, each of which extends from the surface of the interlayer dielectric 19 to the surface of the semiconductor substrate 1 and is placed between the adjacent gate electrodes 3, are formed on a self-aligned basis with the silicon nitride film 18 as the etching stopper. Further, a conductive film is embedded into the contact hole to thereby form a SAC.

As described above, in the method of manufacturing the semiconductor device according to the present fourth embodiment, sidewalls 10, each of which includes the silicon nitride film 8 covering the sides of the gate electrodes 3 and the silicon oxide film 9 covering the silicon nitride film 8, are formed on the sides of the gate electrodes 3 respectively. After formation of a transistor having an LDD structure in a logic area 102, the silicon oxide film 9 formed on each of the sides of the gate electrodes 3 is removed by wet etching. Afterwards, the silicon nitride film 18 for SAC formation is formed, and the interlayer dielectric 19 is formed on the silicon nitride film 18.

According to the manufacturing method, the interval between the adjacent gate electrodes 3 is enlarged by the thicknesses of the removed silicon oxide films 9. Thus, an effect similar to the first embodiment can be obtained.

In the present fourth embodiment, the salicide protection film 15 and the silicon oxide films 9 in the first logic area 102a are removed by one wet etching. Further, the salicide protection film 15 and the silicon oxide films 9 in the DRAM area 101 are removed by one wet etching.

Namely, while the wet etching is carried out three times in the third embodiment, it is done twice in the present fourth embodiment. Thus, the number of process steps for the wet etching can be reduced once. Accordingly, the manufacturing cost of the semiconductor device can be curbed.

Since no metal silicide films 17 are formed in the DRAM area 101 even in the present fourth embodiment in a manner similar to the third embodiment, a high refresh characteristic of a DRAM can be obtained.

Fifth Embodiment

FIGS. 5A through 5K are cross-sectional views for describing a method of manufacturing a semiconductor device according to a fifth embodiment of the present invention.

The method of manufacturing a semiconductor device, according to the fifth embodiment will be described below with reference to FIGS. 5A through 5K. Incidentally, the description of the same process steps as the aforementioned first embodiment will be omitted in the present fifth embodiment.

Figures 5A, 5B, 5C, 5D:
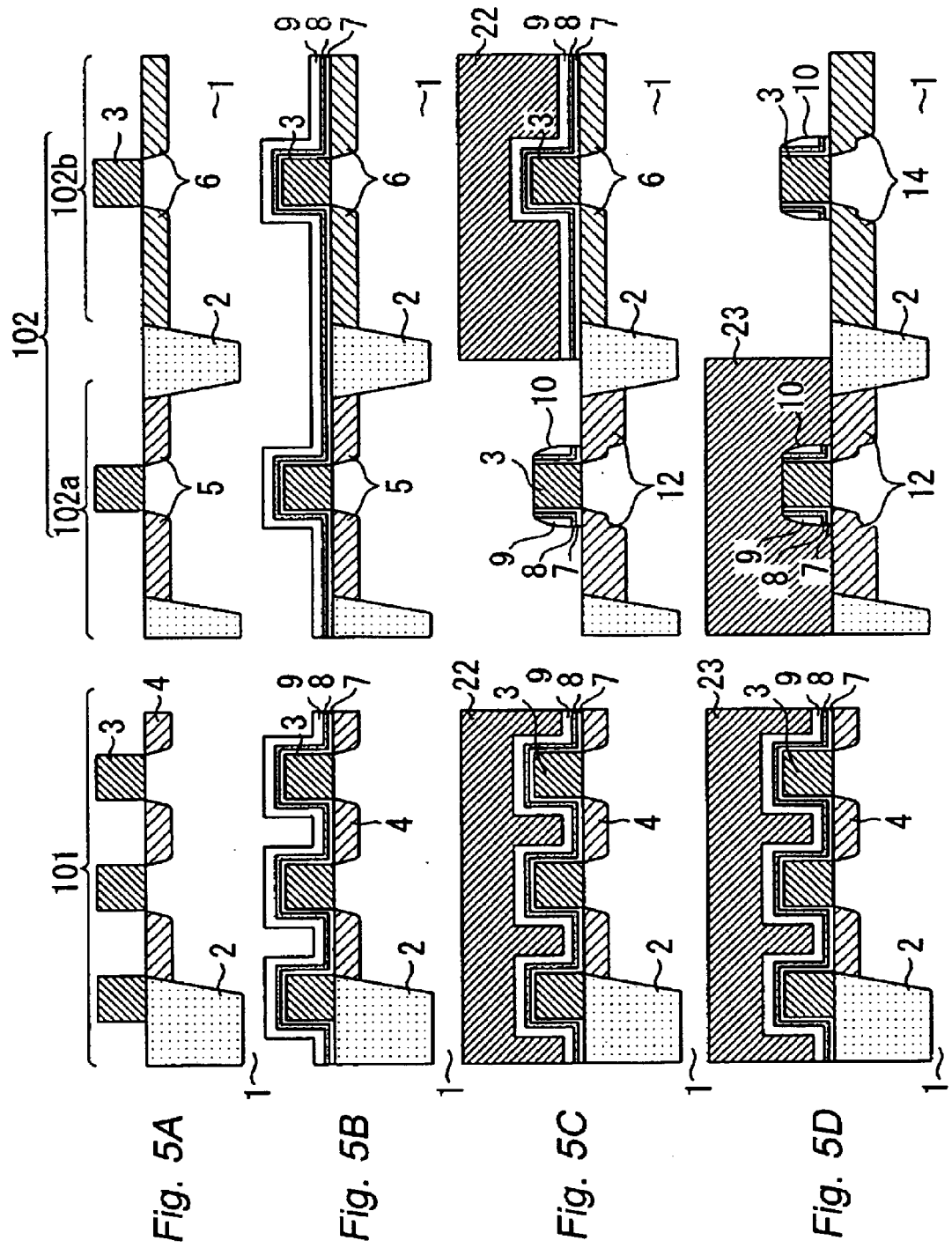
Figures 7A, 7B, 7C:
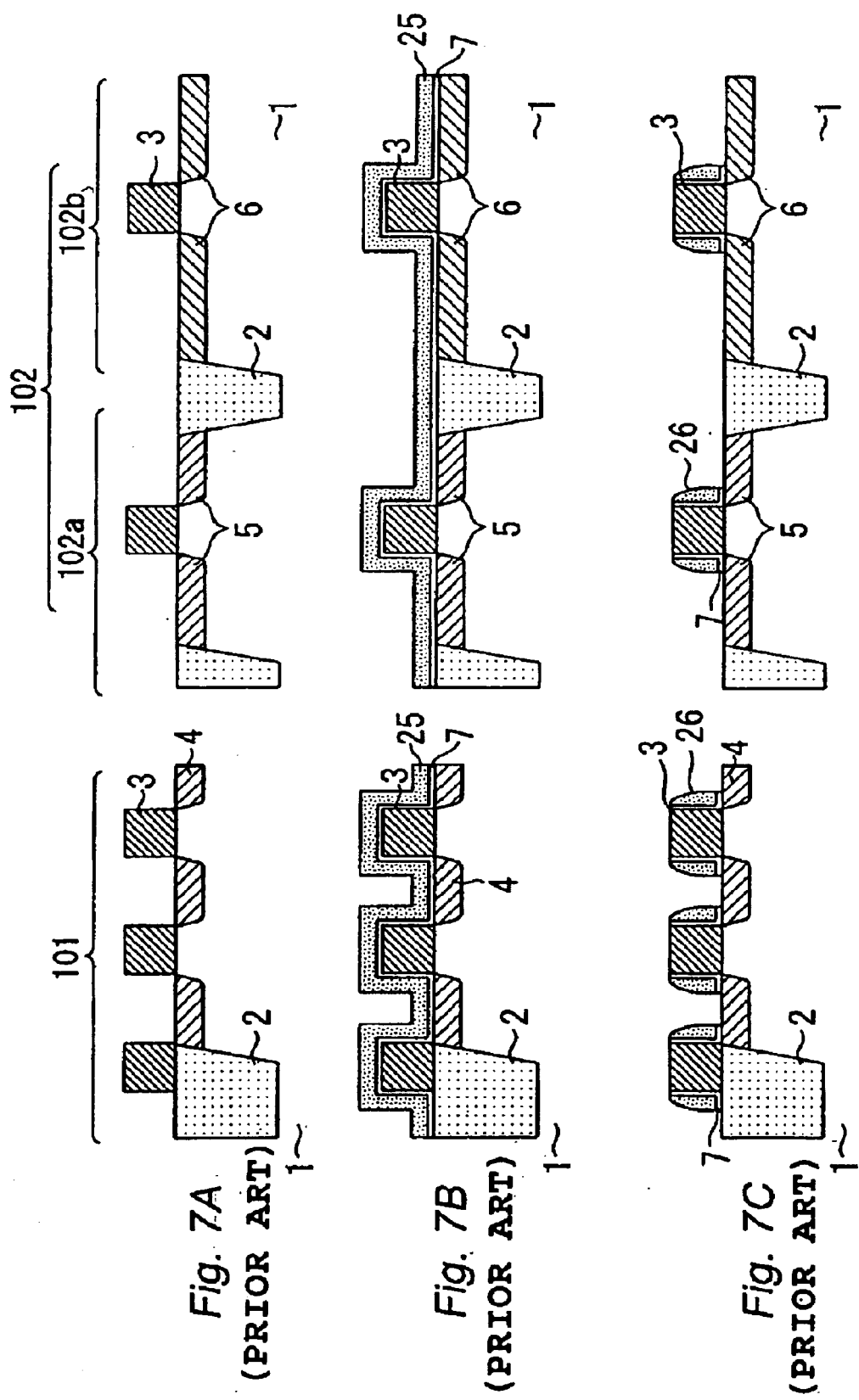
Figures 7D, 7E, 7F:
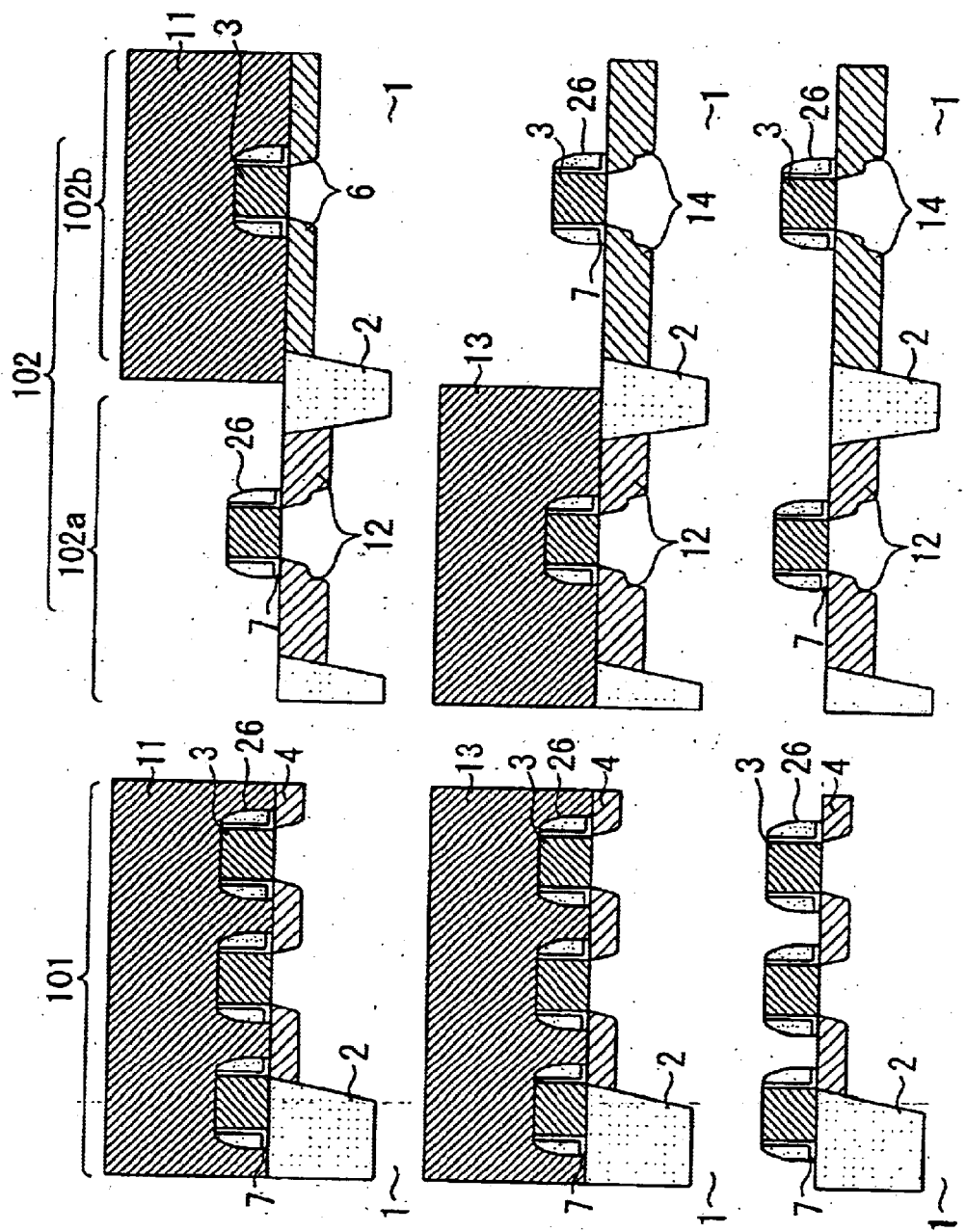
Figure 7J:
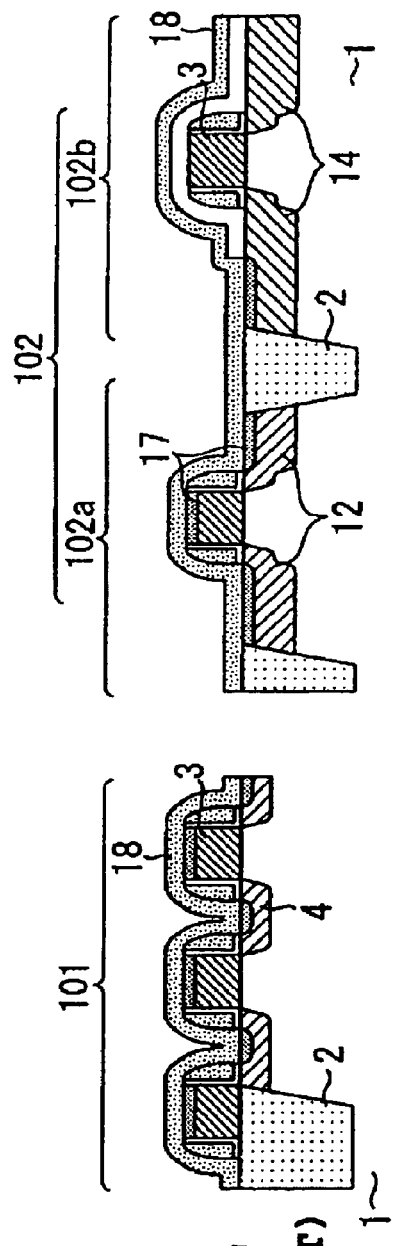
Figure 7K:
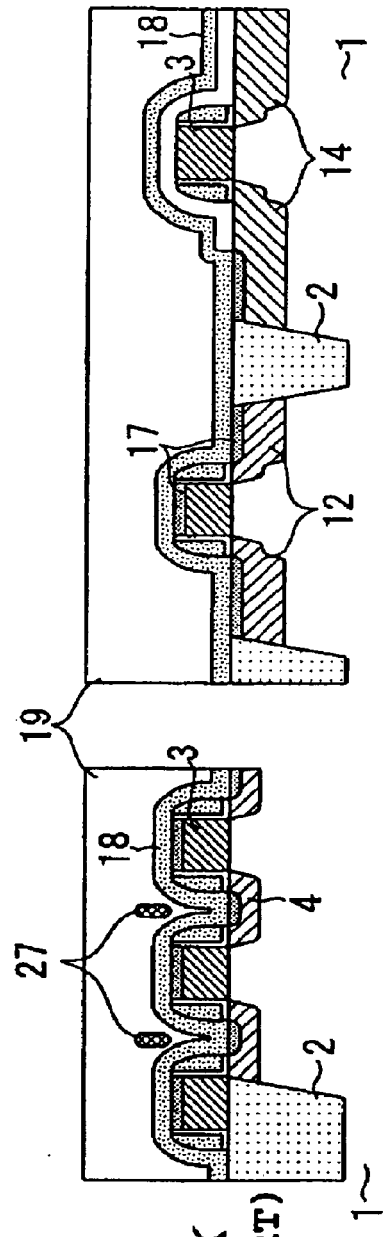

Since steps shown in FIGS. 5A and 5B are identical to the steps shown in FIGS. 1A and 1B employed in the first embodiment, their description will be omitted.

Subsequently to these steps, as shown in FIG. 5C, resist patterns 22, which cover areas other than a first logic area 102a, are formed by a photolithography technique.

Next, a silicon oxide film 9, a silicon nitride film 8 and a silicon oxide film 7 formed in the first logic area 102a are anisotropically etched to thereby form sidewalls 10 on the sides of each gate electrode 3 in the same area 102a.

Further, N$^+$ source/drain regions 12 are formed by implanting an n-type impurity in the first logic area 102a in high concentrations with the sidewalls 10 as masks. Afterwards, the resist patterns 22 are removed.

Next, as shown in FIG. 5D, resist patterns 23, which cover areas other than a second logic area 102b, are formed by the photolithography technique.

Next, the silicon oxide film 9, silicon nitride film 8 and silicon oxide film 7 formed in the second logic area 102b are anisotropically etched to thereby form sidewalls 10 on the sides of each gate electrode 3 in the same area 102b.

Further, P$^+$ source/drain regions 14 are formed by implanting a p-type impurity in the second logic area 102b in high concentrations with the sidewalls 10 as masks.

Since a DRAM area 101 is covered with the resist patterns 22 and 23 respectively in the steps shown in FIGS. 5C and 5D herein, no sidewalls 10 are formed.

Next, the resist patterns 23 are removed as shown in FIG. 5E.

Further, as shown in FIG. 5F, a silicon oxide film 9 formed on the entire surface of a semiconductor substrate is removed by wet etching. Described in detail, the silicon oxide film 9 formed on the silicon nitride film 8 is removed from the DRAM area 101, and silicon oxide films 9 formed on the sides of the gate electrodes 3 are removed from a logic area 102.

Next, as shown in FIG. 5G, a silicon oxide film, which serves as a salicide protection film 15, is formed over the entire surface of the semiconductor substrate 1.

Next, as shown in FIG. 5H, a resist pattern 24, which covers a second logic area 102b, is formed by a photolithography technique. The salicide protection film 15 formed in each of the DRAM area 101 and first logic area 102a is removed by wet etching with the resist pattern 24 as a mask. Afterwards, the resist pattern 24 is removed.

Next, as shown in FIG. 5I, metal silicide films 17 having high melting-point are formed in the first logic area 102a by using a method (salicide method) similar to the first embodiment. Since, at this time, the DRAM area 101 is covered with the silicon nitride film 8, no metal silicide films are formed therein.

Next, as shown in FIG. 5J, a silicon nitride film 18 is formed over the entire surface of the semiconductor substrate 1 by a method similar to the first embodiment. Further, an interlayer dielectric 19 is formed on the silicon nitride film 18 as shown in FIG. 5K.

Next, although not shown, contact holes, each of which extends from the surface of the interlayer dielectric 19 to the surface of the semiconductor substrate 1 and is placed between the adjacent gate electrodes 3, are formed on a self-aligned basis with the silicon nitride film 18 as the etching stopper. Further, a conductive film is embedded into the contact hole to thereby form a SAC.

As described above, in the method of manufacturing a semiconductor device according to the present fifth embodiment, the silicon nitride film 8 and the silicon oxide film 9 are stacked on the semiconductor substrate 1. The stacked films 8 and 9 are anisotropically etched in the logic area 102 to thereby form the sidewalls 10. After formation of a transistor having an LDD structure in the logic area 102, the silicon oxide film 9 formed on the entire surface of the semiconductor substrate 1 is removed by wet etching. Afterwards, the silicon nitride film 18 for SAC formation is formed, and the interlayer dielectric 19 is formed on the silicon nitride film 18.

According to the manufacturing method, the interval between the adjacent gate electrodes 3 is enlarged by the thicknesses of the removed silicon oxide films 9. Thus, an effect similar to the first embodiment can be obtained.

In the method of manufacturing the semiconductor device, according to the present fifth embodiment, the number of steps for the photolithography can be reduced once as compared with the manufacturing method according to the third or fourth embodiment. Accordingly, the manufacturing cost of the semiconductor device can be reduced.

Since no metal silicide films 17 are formed in the DRAM area 101 even in the present fifth embodiment in a manner similar to the third embodiment, a high refresh characteristic of a DRAM can be obtained.

Sixth Embodiment

FIGS. 6A through 6J are cross-sectional views for describing a method of manufacturing a semiconductor device according to a sixth embodiment of the present invention.

The method of manufacturing a semiconductor device according to the sixth embodiment will be described below with reference to FIGS. 6A through 6J. Incidentally, the description of the same process steps as the aforementioned fifth embodiment will be omitted in the present sixth embodiment.

Since steps shown in FIG. 6A through 6E are identical to the steps shown in FIG. 5A through 5E employed in the fifth embodiment, their description will be omitted.

Subsequently to these steps, as shown in FIG. 6F, a silicon oxide film used as a salicide protection film 15, is formed over the entire surface of a semiconductor substrate 1.

Next, as shown in FIG. 6G, a resist pattern 24, which covers a second logic area 102b, is formed by a photolithography technique.

Further, the salicide protection film 15 and a silicon oxide film 9 formed in a DRAM area 101 and a first logic area 102a are removed by wet etching with the resist pattern 24 as a mask.

Next, as shown in FIG. 6H, metal silicide films 17 having high melting-point are formed in the first logic area 102a by using a method (salicide method) similar to the first embodiment. Since, at this time, the DRAM area 101 is covered with the silicon nitride film 8, no metal silicide films are formed therein.

Next, as shown in FIG. 6I, a silicon nitride film 18 is formed over the entire surface of the semiconductor substrate 1 by a method similar to the first embodiment. Further, an interlayer dielectric 19 is formed on the silicon nitride film 18 as shown in FIG. 6J.

Next, although not shown, contact holes, each of which extends from the surface of the interlayer dielectric 19 to the surface of the semiconductor substrate 1 and is placed between the adjacent gate electrodes 3, are formed on a self-aligned basis with the silicon nitride film 18 as the etching stopper. Further, a conductive film is embedded into the contact hole to thereby form a SAC.

As described above, in the method of manufacturing a semiconductor device according to the present sixth embodiment, a silicon nitride film 8 and a silicon oxide film 9 are stacked on the semiconductor substrate 1. The stacked films 8 and 9 are anisotropically etched in a logic area 102 to thereby form sidewalls 10. After formation of a transistor having an LDD structure in the logic area 102, the silicon oxide film 9 is removed by wet etching. Afterwards, the silicon nitride film 18 for SAC formation is formed, and the interlayer dielectric 19 is formed on the silicon nitride film 18.

According to the manufacturing method, the interval between the adjacent gate electrodes 3 is enlarged by the thicknesses of the removed silicon oxide films 9. Thus, an effect similar to the first embodiment can be obtained.

In the method of manufacturing the semiconductor device, according to the present sixth embodiment, the number of steps for the photolithography can be reduced once as compared with the manufacturing method according to the third or fourth embodiment in a manner similar to the fifth embodiment. Further, the salicide protection film 15 and the silicon oxide films 9 are removed by one wet etching, so that the wet etching step can be reduced as compared with the manufacturing method according to the fifth embodiment.

Accordingly, the manufacturing cost of the semiconductor device can be reduced.

Since no metal silicide films 17 are formed in the DRAM area 101 even in the present sixth embodiment in a manner similar to the third embodiment, a high refresh characteristic of a DRAM can be obtained.

This invention, when practiced illustratively in the manner described above, provides the following major effects:

According to the present invention, sidewalls including a first insulating film which covers the sides of gate electrodes, and a second insulating film which covers the first insulating film, are formed on the sides of the gate electrodes respectively. After the second insulating film is removed by wet etching, an interlayer dielectric is formed. Accordingly, the interval between the gate electrodes can be enlarged by the removed second insulating film. Thus, the interlayer dielectric can be embedded with no space even in an area in which the intervals between the respective gate electrodes are narrow.

Using a silicon oxide film containing either boron or phosphor or both thereof as the second insulating film enables an etching rate of the second insulating film by wet etching to be enhanced.

Further, the present invention is not limited to these embodiments, but variations and modifications may be made without departing from the scope of the present invention.

The entire disclosure of Japanese Patent Application No. 2001-057659 filed on Mar. 2, 2001 containing specification, claims, drawings and summary are incorporated herein by reference in its entirety.

What is claimed is:

1. A method of manufacturing a semiconductor device having a first area, a second area and a third area on a semiconductor substrate, comprising:

a step of forming plurality of gate electrodes over the semiconductor substrate;

a step of forming lightly-doped regions by implanting an impurity in the semiconductor substrate with the gate electrodes as masks;

a step of forming a first insulating film on the whole surface of the semiconductor substrate so as to cover the plurality of gate electrodes;

a step of forming a second insulating film on the first insulating film;

a step of forming sidewalls on the sides of the plurality of gate electrodes respectively by means of etching the first insulating film and the second insulating film, each of the sidewalls including a layer for the first insulating film covering the sides of the gate electrodes and a layer for the second insulating film covering the layer for the first insulating film;

a step of forming heavily-doped regions by implanting an impurity in the second area and the third area with the sidewalls as masks;

a first removing step of removing the layer for the second insulating film formed on the sides of the gate electrodes after said step of forming heavily doped regions;

a third insulating film forming step of forming a third insulating film on the whole surface of the semiconductor substrate after said first removing step; and an interlayer dielectric forming step of forming an interlayer dielectric on the third insulating film.

2. The method of manufacturing a semiconductor device according to claim 1, further comprising:

a step of forming a protective insulating film on the whole surface of the semiconductor substrate;

a second removing step of removing the protective insulating film formed on the first area and the second area; and a step of forming a silicide film in upper layer portion of the gate electrodes formed in the first area and the second area and in heavily-doped regions adjacent to the layer for the first insulating film at the sides of the gate electrodes;

wherein the above steps are carried out prior to said third insulating film forming step after said first removing step.

3. The method of manufacturing a semiconductor device according to claim 1, further comprising:

a step of forming a protective insulating film on the whole surface of the semiconductor substrate; and a step of forming a silicide film in upper layer portions of the gate electrodes formed in the first area and the second area and in heavily doped regions adjacent to the layer for the first insulating film at the sides of the gate electrodes;

wherein said step of forming a protective insulating film is carried out prior to said first removing step after said impurity implanting step:

in said first removing step, the protective insulating film is removed from the first area and the second area as well as the layer for the second insulating film; and said step of forming a silicide film is carried out prior to said third insulating film forming step after said first removing step.

4. The method of manufacturing a semiconductor device according to claim 1, further comprising:

a step of forming a protective insulating film on the whole surface of the semiconductor substrate;

a second removing step of removing the protective insulating film formed in the second area;

a step of forming a silicide film in upper layer portions of the gate electrodes formed in the second area and in heavily-doped regions adjacent to the layer for the first insulating film at the sides of the gate electrodes; and subsequently a third removing step of removing the protective insulating film formed in the first area;

wherein the above steps are carried out prior to said third insulating film forming step after said first removing step.

5. The method of manufacturing a semiconductor device according to claim 1, further comprising:

a step of forming a protective insulating film on the whole surface of the semiconductor substrate;

a step of forming a silicide film in upper layer portions of the gate electrodes formed in the second area and in heavily-doped regions adjacent to the layer for the first insulating film at the sides of the gate electrodes; and subsequently a second removing step of removing the protective insulating film formed in the first area and the layer for the second insulating film formed on the sides of the gate electrodes;

wherein said step of forming a protective insulating film is carried out prior to said first removing step after of forming heavily-doped regions step;

in said first removing step, the protective insulating film and the second insulating film formed in the second area are removed; and said step of forming a silicide film and said second removing step are carried out prior to said third insulating film forming step after said removing step.

6. The method of manufacturing a semiconductor device according to claim 1, further comprising:

a step of forming contact holes in the first area on a self-aligned basis with the third insulating film as an etching stopper, each of contact holes extending from the surface of the interlayer dielectric to the surface of the semiconductor substrate and being placed between the gate electrodes, wherein said step of forming contact holes is carried out after said interlayer dielectric forming step.

7. The method of manufacturing a semiconductor device according to claim 1, wherein the first area is a DRAM area, the second area is a first logic area, and the third area is a second logic area.

8. The method of manufacturing a semiconductor device according to claim 1, wherein the second insulating film formed in said second insulating film forming step is a silicon oxide film which contains either boron or phosphor or both.

9. A method of manufacturing a semiconductor device having a first area, a second area and a third area on a semiconductor substrate, comprising:

a step of forming a plurality of gate electrodes over the semiconductor substrate;

a step of forming lightly-doped regions by implanting an impurity in the semiconductor substrate with the gate electrodes as masks;

a step of forming a first insulating film on the whole surface of the semiconductor substrate so as to cover the gate electrodes;

a second insulating film forming step of forming a second insulating film on the first insulating film;

a step of forming first sidewalls on the sides of the plurality of gate electrodes respectively by means of etching the first insulating film and the second insulating film formed in the second area, each of the first sidewalls including a layer for the first insulating film covering the sides of the gate electrodes and a layer for the second insulating film covering the layer for the first insulating film;

a first impurity implanting step of forming heavily-doped regions by implanting an impurity in the second area with the first sidewalls as masks;

a step of forming second sidewalls on the sides of the gate electrodes by means of etching the first insulating film and the second insulating film formed in the third area, the second sidewalls including a layer for the first insulating film covering the sides of the gate electrodes and a layer for the first insulating film;

a second impurity implanting step of forming heavily-doped regions by implanting an impurity in the third area with the second sidewalls as masks;

a first removing step of removing the second insulating film formed in the first area and the layer for the second insulating film formed in the second area and the third area after said first impurity implanting step and said second impurity implanting step;

a third insulating film forming step of forming a third insulating film on the whole surface of the semiconductor substrate after said first removing step; and an interlayer dielectric forming step of forming an interlayer dielectric on the third insulating film.

10. The method of manufacturing a semiconductor device according to claim 9, further comprising:

a step of forming a protective insulating film on the whole surface of the semiconductor substrate;

a second removing step of removing the protective insulating film formed in the first area and the second area; and a step of forming a silicide film in upper layer portions of the gate electrodes formed in the second area and in heavily-doped regions adjacent to the layer for the first insulating film at the sides of the gate electrodes;

wherein the above steps are carried out prior to said third insulating film forming step after said first removing step.

11. The method of manufacturing a semiconductor device according to claim 9, further comprising:

a step of forming a protective insulating film on the whole surface of the semiconductor substrate; and a step of forming a silicide film in upper layer portions of the gate electrodes formed in the second area and in heavily-doped regions adjacent to the layer for the first insulating film at the sides of the gate electrodes;

wherein said step of forming a protective insulating film is carried out prior to said first removing step after said second impurity implanting step:

in said first removing step, the second insulating film and the layer for the second insulating film are removed and the protective insulating film formed in the first area and the second area is removed; and said step of forming a silicide film is carried out prior to said third insulating film forming step after said first removing step.

12. The method of manufacturing a semiconductor device according to claim 9, further comprising:

a step of forming contact holes in the first area on a self-aligned basis with the third insulating film as an etching stopper, each of contact holes extending from the surface of the interlayer dielectric to the surface of the semiconductor substrate and being placed between the gate electrodes;

wherein said step of forming contact holes is carried out after said interlayer dielectric forming step.

13. The method of manufacturing a semiconductor device according to claim 9, wherein the first area is a DRAM area, the second area is a first logic area, and the third area is a second logic area.

14. The method of manufacturing a semiconductor device according to claim 9, wherein the second insulating film formed in said second insulating film forming step is a silicon oxide film which contains either boron or phosphor or both.

15. A method of manufacturing a semiconductor device, comprising:

a step of forming a plurality of gate electrodes over a semiconductor substrate;

a step of forming lightly-doped regions by implanting an impurity in the semiconductor substrate with the gate electrodes as mask;

a step of forming a first insulating film on the whole surface of the semiconductor substrate so as to cover the gate electrodes;

a step of forming a second insulating film on the first insulating film;

a step of forming sidewalls on the sides of the gate electrodes respectively by means of etching the first insulating film and the second insulating film, each of the sidewalls including a layer for the first insulating film covering the sides of the gate electrodes and a layer for the second insulating film covering the layer for the first insulating film;

a step of forming heavily-doped regions by implanting an impurity in the semiconductor substrate with the sidewalls as masks;

a step of removing the layer for the second insulating film formed on the sides of the gate electrodes after said step of forming heavily-doped regions;

a step of forming a third insulating film on the whole surface of the semiconductor substrate after said removing step;

a step of forming an interlayer dielectric on the third insulating film; and a step of forming contact holes on a self-aligned basis with the third insulating film as an etching stopper, each of the contact holes extending from the surface of the interlayer dielectric to the surface of the semiconductor substrate and being placed between the gate electrodes.

16. The method of manufacturing a semiconductor device according to claim 15, wherein the second insulating film formed in said second insulating film forming step is a silicon oxide film which contains either boron or phosphor or both.

* * * * *